United States Patent [19]
Graham et al.

[11] Patent Number: 5,900,737
[45] Date of Patent: May 4, 1999

[54] METHOD AND APPARATUS FOR AUTOMATED DOCKING OF A TEST HEAD TO A DEVICE HANDLER

[75] Inventors: Daniel J. Graham, West Berlin; Alyn R. Holt; Robert E. Matthiessen, both of Cherry Hill, all of N.J.; I. Marvin Weilerstein, Jenkintown, Pa.; Christopher L. West, Vincentown, N.J.

[73] Assignee: INTEST Corporation, Cherry Hill, N.J.

[21] Appl. No.: 08/643,967

[22] Filed: May 7, 1996

Related U.S. Application Data

[60] Division of application No. 08/355,501, Dec. 12, 1994, Pat. No. 5,600,258, which is a continuation-in-part of application No. 08/122,055, Sep. 15, 1993, Pat. No. 5,440,943.

[51] Int. Cl.⁶ ........................................... G01R 31/02
[52] U.S. Cl. ........................................ 324/758; 324/158.1
[58] Field of Search ............................ 324/158.1, 758, 324/754; 414/590; 901/46, 48, 23, 24

[56] References Cited

U.S. PATENT DOCUMENTS

| | | | |
|---|---|---|---|
| 2,697,529 | 12/1954 | Hubbell et al. | 414/732 |
| 3,007,097 | 10/1961 | Shelley et al. | 318/575 |
| 3,262,593 | 7/1966 | Hainer | 414/619 |
| 3,665,148 | 5/1972 | Yasenchak et al. | 901/48 |
| 3,826,383 | 7/1974 | Richter | 414/730 |
| 4,160,207 | 7/1979 | Haines | 324/754 |
| 4,199,294 | 4/1980 | Streck et al. | 901/25 |
| 4,229,136 | 10/1980 | Panissidi | 901/48 |
| 4,272,892 | 6/1981 | Rose | 324/758 |
| 4,273,506 | 6/1981 | Thomson et al. | 414/735 |
| 4,303,368 | 12/1981 | Dent et al. | 414/590 |
| 4,328,553 | 5/1982 | Fredriksen et al. | 364/559 |
| 4,379,335 | 4/1983 | Kirsch et al. | 901/22 |
| 4,403,680 | 9/1983 | Hillesheimer | 177/146 |
| 4,527,942 | 7/1985 | Smith | 901/48 |
| 4,589,815 | 5/1986 | Smith | 324/758 |
| 4,652,204 | 3/1987 | Arnett | 414/729 |
| 4,705,447 | 11/1987 | Smith | 414/590 |
| 4,751,457 | 6/1988 | Veenendaal | 324/758 |
| 4,893,074 | 1/1990 | Holt et al. | 324/758 |
| 4,934,064 | 6/1990 | Yamaguchi et al. | 324/758 |
| 4,936,023 | 6/1990 | Pechak | 33/706 |
| 5,030,869 | 7/1991 | Holt et al. | 324/758 |
| 5,124,644 | 6/1992 | Ganapol | 324/754 |
| 5,148,100 | 9/1992 | Sekiba | 324/765 |
| 5,180,975 | 1/1993 | Andoh et al. | 324/758 |
| 5,196,998 | 3/1993 | Fulton | 364/167.01 |
| 5,263,775 | 11/1993 | Smith et al. | 374/134 |
| 5,321,351 | 6/1994 | Swart et al. | 324/758 |
| 5,321,352 | 6/1994 | Takebuchi et al. | 324/758 |
| 5,390,104 | 2/1995 | Fulton | 364/167.01 |
| 5,404,111 | 4/1995 | Mori et al. | 324/758 |
| 5,513,948 | 5/1996 | Bacchi et al. | 414/590 |

FOREIGN PATENT DOCUMENTS

| | | |
|---|---|---|
| 102217 | 3/1984 | European Pat. Off. |
| 342045 | 11/1989 | European Pat. Off. |
| 468906 | 1/1992 | European Pat. Off. |
| 526966 | 2/1993 | European Pat. Off. |
| 032119 | 7/1981 | Germany. |

*Primary Examiner*—Ernest F. Karlsen
*Attorney, Agent, or Firm*—Ratner & Prestia

[57] ABSTRACT

A positioner facilitates docking and undocking of an electronic test head with a device handler. The positioner provides for rotation of the test head about a first axis. The positioner includes a linkage arm structure for moving the test head along a second axis orthogonal to the first axis. Using motors, sensors and a processor, the linkage arm structure accurately docks the electronic test head with the device handler.

17 Claims, 43 Drawing Sheets

Microfiche Appendix Included
(01 Microfiche, 1994 Pages)

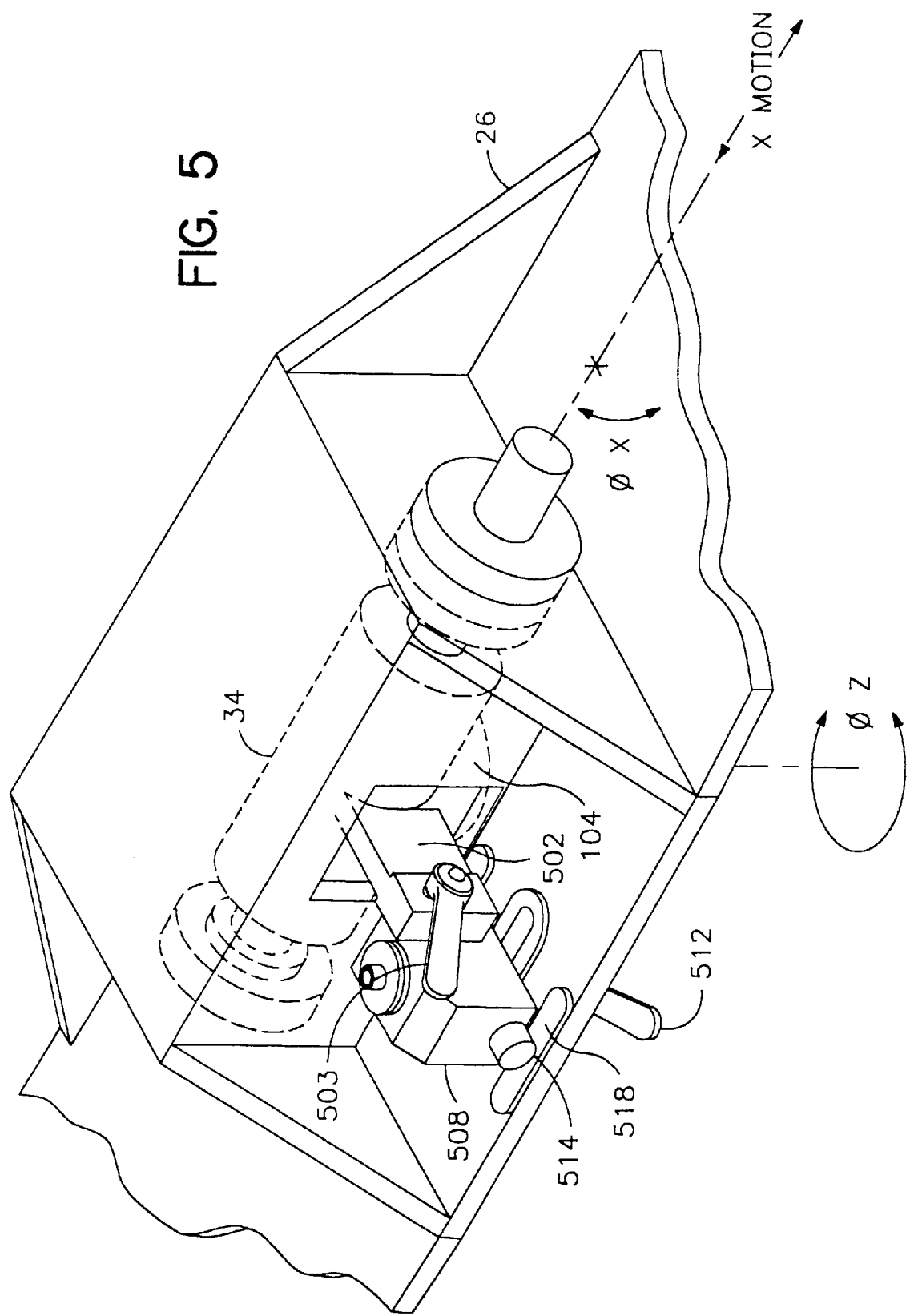

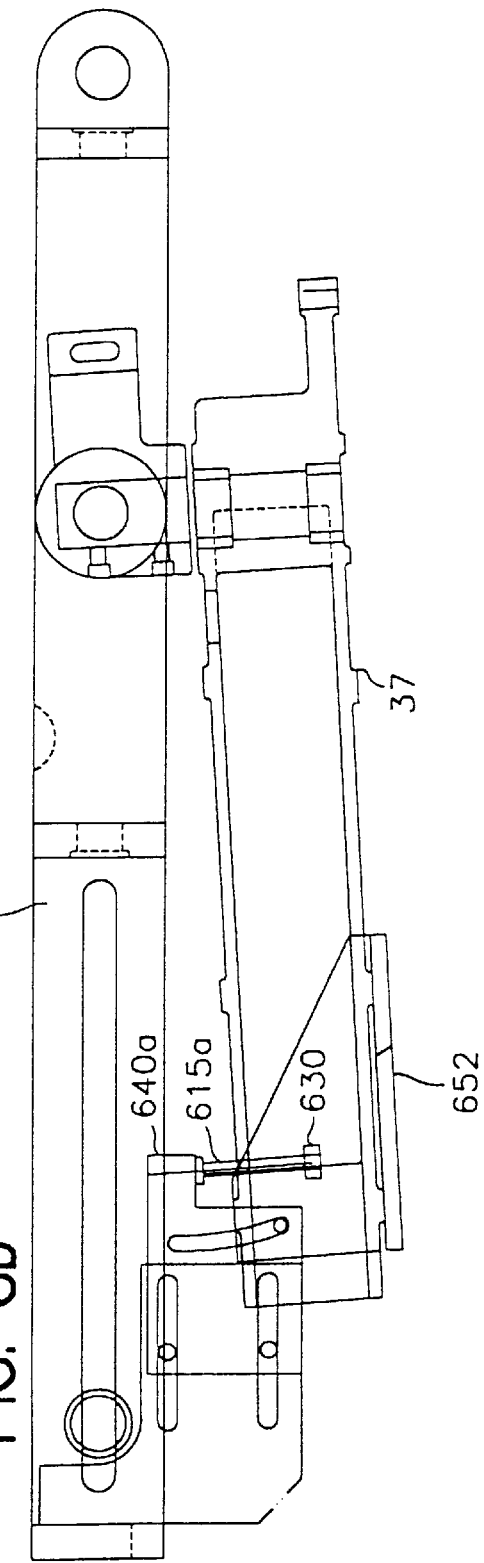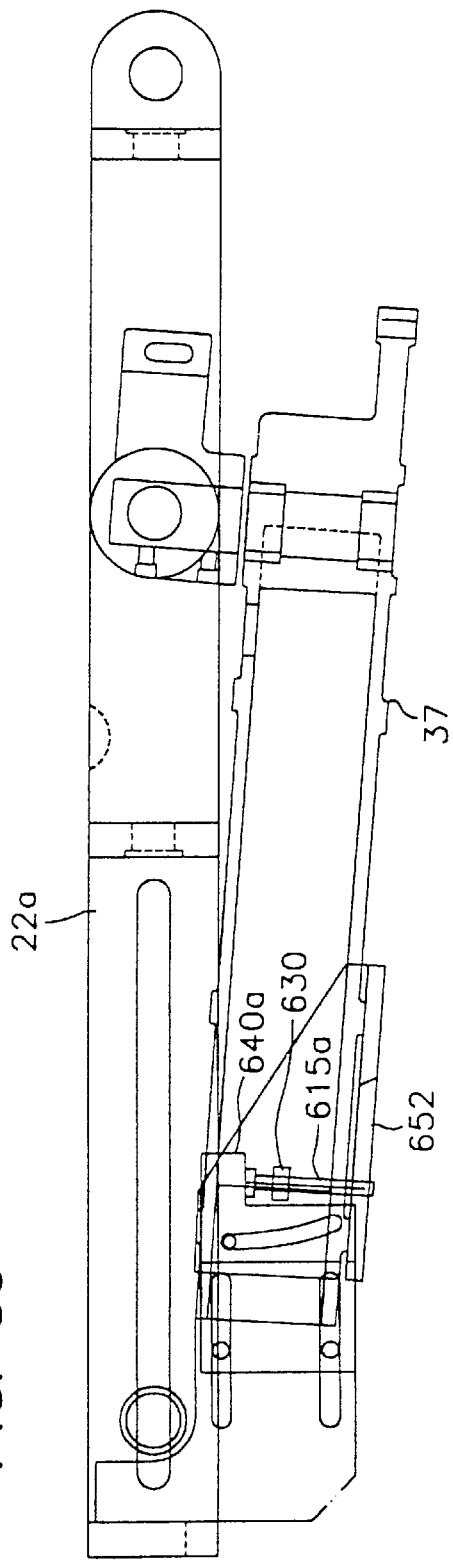

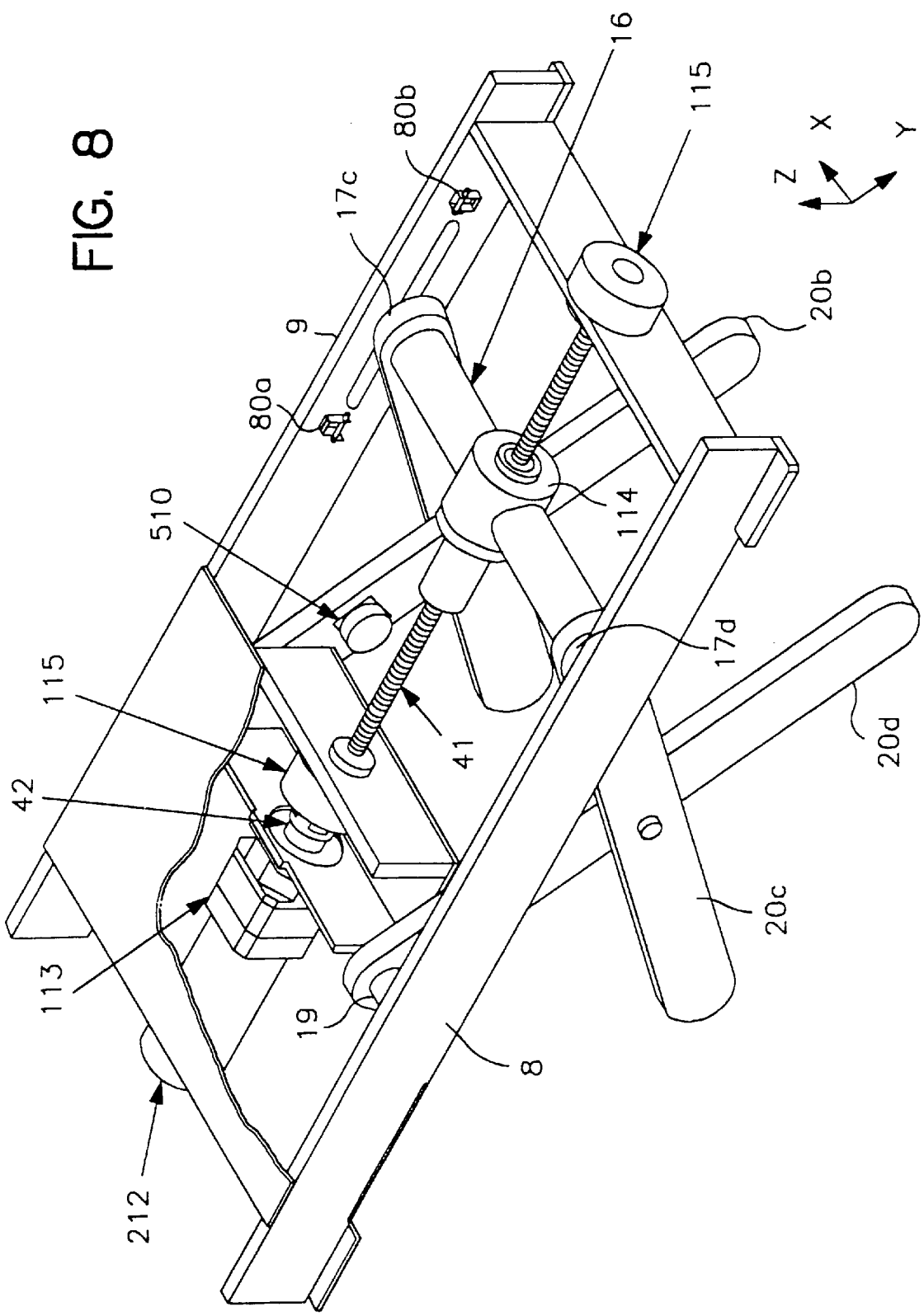

FIG. 18

SUBROUTINE FILE 4
OPERATOR SCREEN

| FIG. 18a | FIG. 18a | FIG. 18a |

IF MOTION COMMAND IN PROGRESS, OR IF IT IS CANCELLED
THEN RESET LATCHED DOCK BIT

↓

IF A NEW MOVE IS COMMANDED (PUSHBUTTON ENTRY)
OR AN IN-PROGRESS COMMAND IS CANCELLED,
OR IF A FAULT HAS BEEN DETECTED,
THEN STOP VERTICAL OR ROLL MOTION
    CLEAR COMMAND BITS
    RESET MOTION SEQUENCE STATE TO 0

↓

IF A NEW MOVE IS COMMANDED (DOCK, UNDOCK,
MAINTENANCE, MANUAL)
THEN SET ITS COMMAND BIT
SET THE MOTION SEQUENCE STATE TO 1

↓

IF MOTION SEQUENCE STATE IS 1
THEN CALL MOVE UP SUBROUTINE, FILE 12
    MOVE HEAD TO TOP POSITION      → SUBROUTINE FILE 12

↓

IF MOTION SEQUENCE STATE IS 2
AND MOTORS ARE STOPPED
THEN SET MOTION SEQUENCE STATE TO 3

↓

IF MOTION SEQUENCE STATE IS 3
THEN CALL COARSE ROLL SUBROUTINE FILE 16
    ROLL TO TAUGHT POSITION
    SET MOTION SEQUENCE STATE TO 4    → SUBROUTINE FILE 16

↓

IF MOTION SEQUENCE STATE IS 4
AND ROLL MOTOR HAS STOPPED
THEN SET MOTION SEQUENCE STATE TO 5

↓

IF MOTION SEQUENCE STATE IS 5
THEN CALL MOVE DOWN SUBROUTINE, FILE 13
    SET MOTION SEQUENCE STATE TO 6    → SUBROUTINE FILE 13

FIG. 18a

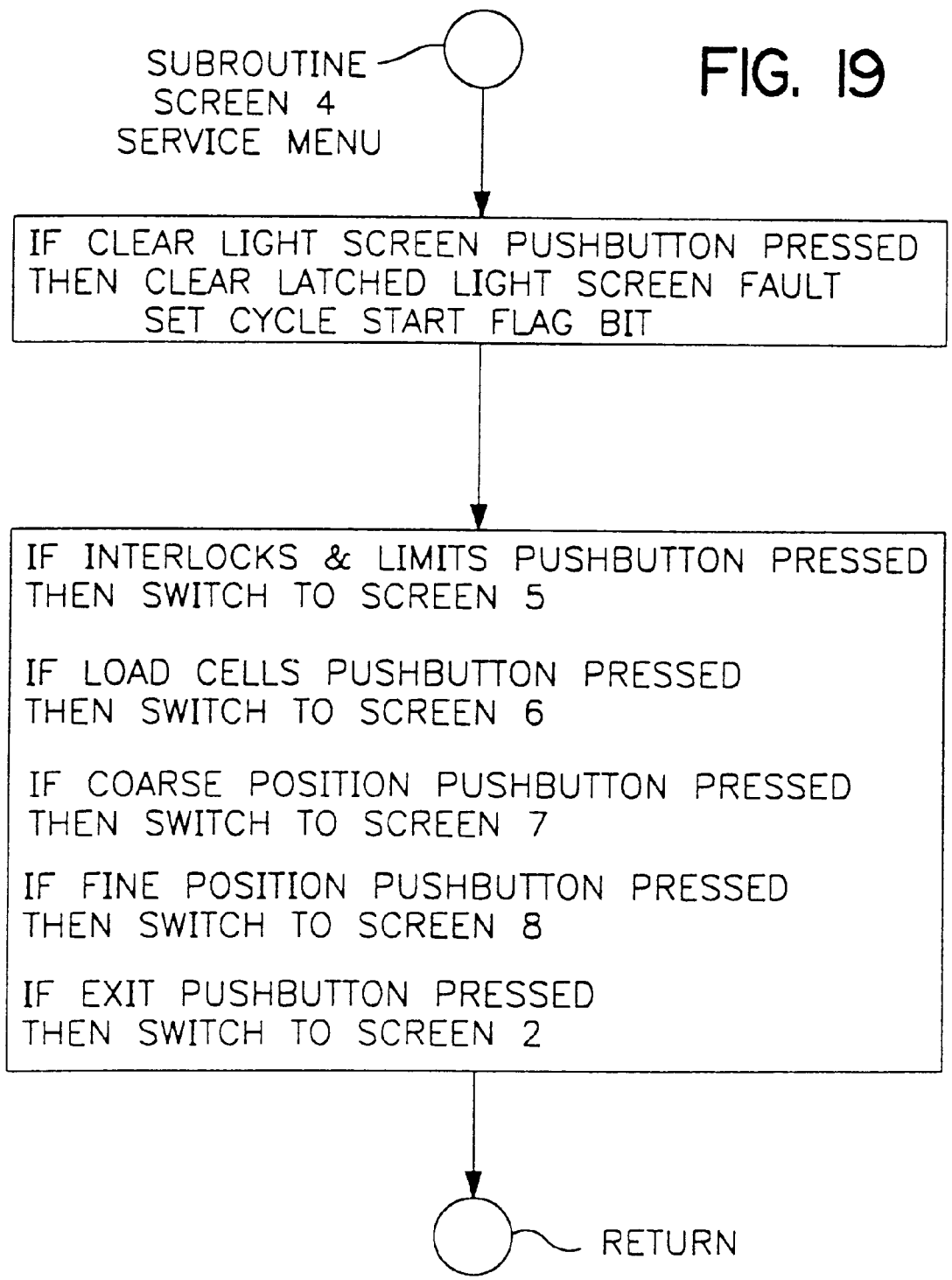

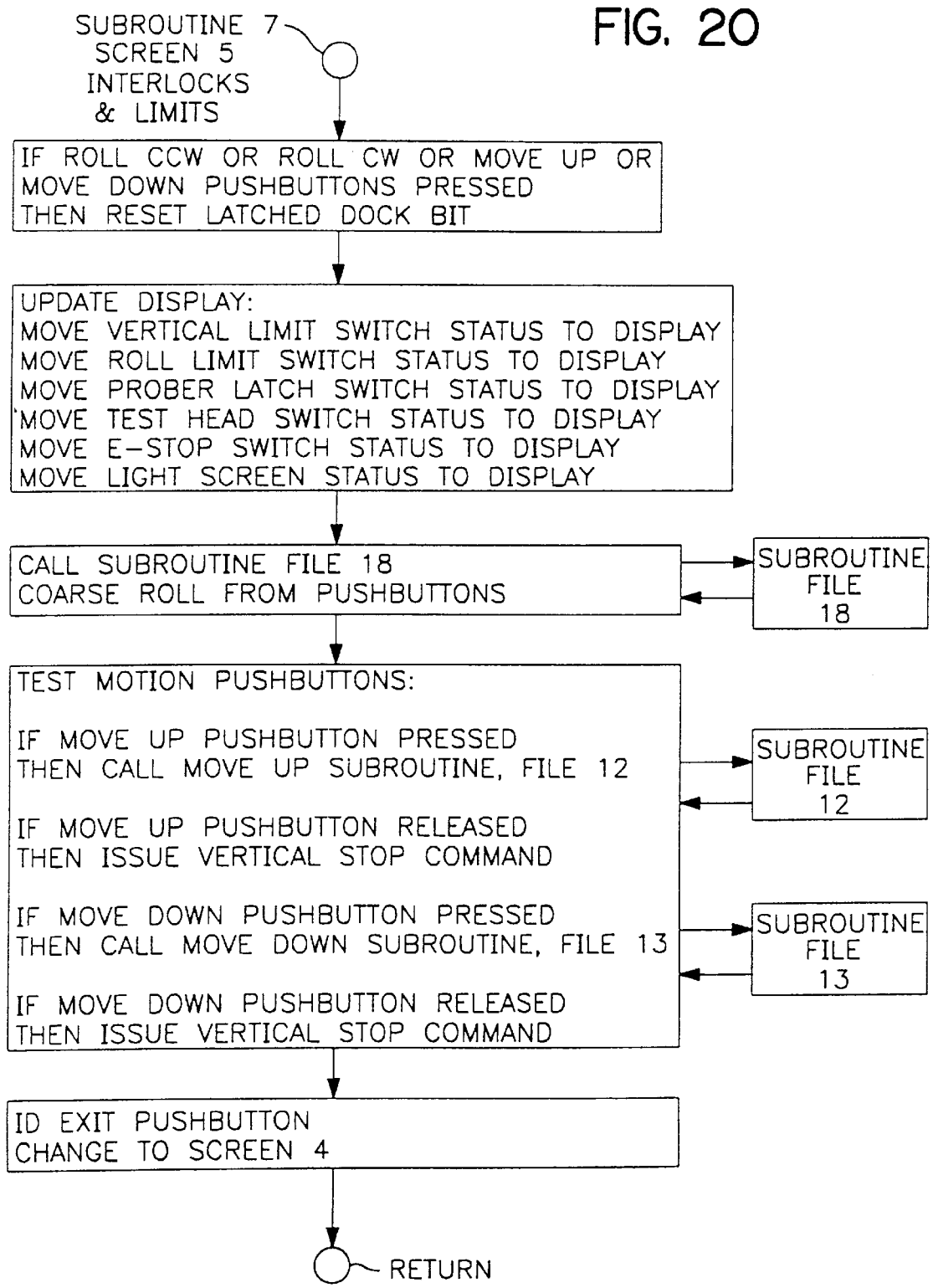

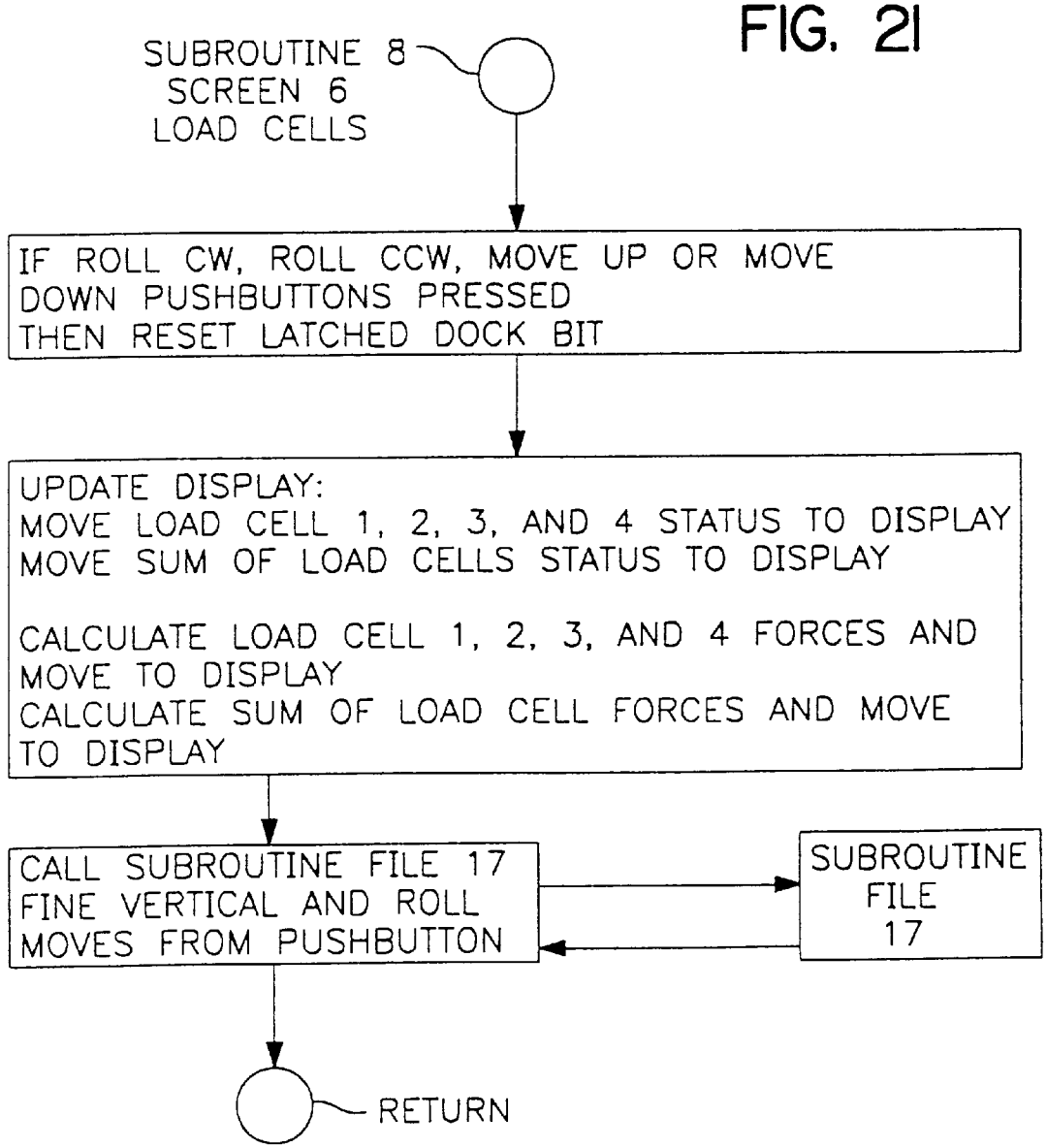

FIG. 26

SUBROUTINE FILE 13 — MOVE DOWN

---

IF ONE-SCAN BIT FOR MOVE DOWN PUSHBUTTON
OR ONE-SCAN BIT FOR UNDOCK, MAINTENANCE, MANUAL, OR DOCK MOVING DOWN
AND IF VERTICAL STATE 5,
THEN ISSUE VERTICAL MOVE, DOWN, CONTINUOUS, SLOW
AND IF VERTICAL STATE 4
THEN ISSUE VERTICAL MOVE DOWN, CONTINUOUS, MEDIUM
AND IF VERTICAL STATE 3
THEN ISSUE VERTICAL MOVE DOWN, CONTINUOUS, FAST
AND IF VERTICAL STATE 2
THEN ISSUE VERTICAL MOVE DOWN, CONTINUOUS, FAST
AND IF VERTICAL STATE 1
THEN ISSUE VERTICAL MOVE DOWN, CONTINUOUS, MEDIUM

---

IF NOT ONE-SCAN BIT FOR MOVE DOWN PUSHBUTTON
AND NOT ONE-SCAN BIT FOR UNDOCK, MANUAL, MAINTENANCE OR DOCK MOVING DOWN
AND IF OLD VERTICAL STATE IS 5 AND NEW STATE IS 4
THEN ISSUE VERTICAL MOVE DOWN, CONTINUOUS, MEDIUM
AND IF OLD VERTICAL STATE IS 4 AND NEW STATE IS 3
THEN ISSUE VERTICAL MOVE DOWN, CONTINUOUS, FAST
AND IF OLD VERTICAL STATE IS 3 AND NEW STATE IS 2
THEN ISSUE VERTICAL MOVE DOWN, CONTINUOUS, FAST
AND IF OLD VERTICAL STATE IS 2 AND NEW STATE IS 1
THEN ISSUE VERTICAL MOVE DOWN, CONTINUOUS, MEDIUM

---

IF IN AUTOMATIC MOVE AND NEAR TAUGHT DESTINATION
THEN ISSUE VERTICAL MOVE DOWN, CONTINUOUS, SLOW

IF AT TAUGHT VERTICAL DESTINATION
OR IF NEW VERTICAL STATE IS 0
THEN ISSUE VERTICAL STOP

---

RETURN

SUBROUTINE FILE 16
COARSE
ROLL MOVE

FIG. 28

MOVE CONTENTS OF NEW ROLL STATE
REGISTER TO OLD ROLL STATE REGISTER

CALCULATE ROLL DESTINATION MINUS ROLL
ICLINOMETER ANGLE

IF DIFFERENCE <=-3.0 DEGREES
THEN NEW ROLL STATE IS 0
IF DIFFERENCE BETWEEN -3.0 AND -0.2DEG.
THEN ROLL STATE IS 1
IF DIFFERENCE BETWEEN -0.1 AND 0.1 DEG.
THEN NEW ROLL STATE IS 2
IF DIFFERENCE IS BETWEEN 0.2 AND 3.0 DEG.
THEN NEW ROLL STATE IS 3
IF DIFFERENCE IS >=3.0 DEGREES
THEN NEW ROLL STATE IS 4

IF UNDOCK OR MAINTENANCE OR MANUAL OR DOCK
TOP STATE ONE-SCAN

AND ROLL STATE IS 0
THEN ISSUE ROLL MOVE CCW, CONTINUOUS, FAST
AND ROLL STATE IS 1
THEN ISSUE ROLL MOVE CCW, CONTINUOUS, SLOW
AND ROLL STATE IS 3
THEN ISSUE ROLL MOVE CW, CONTINUOUS, SLOW
AND ROLL STATE IS 4
THEN ISSUE ROLL MOVE CW, CONTINUOUS, FAST

IF NOT UNDOCK OR MAINTENANCE OR MANUAL OR DOCK
TOP STATE ONE-SCAN

AND OLD ROLL STATE IS 0, AND NEW ROLL STATE IS 1
THEN ISSUE ROLL MOVE CCW, CONTINUOUS, SLOW
AND OLD ROLL STATE IS 4, AND NEW ROLL STATE IS 3
THEN ISSUE ROLL MOVE CW, CONTINUOUS, SLOW

RETURN

SUBROUTINE FILE 17
FINE VERTICAL AND
ROLL MOVES FROM
PUSHBUTTONS

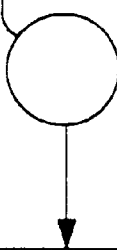

IF MOVE UP PUSHBUTTON PRESSED
THEN ISSUE VERTICAL MOVE UP, FIXED, SMALL
IF MOVE UP PUSHBUTTON RELEASED
THEN ISSUE VERTICAL STOP

IF MOVE DOWN PUSHBUTTON PRESSED
THEN ISSUE VERTICAL MOVE DOWN, FIXED, SMALL
IF MOVE DOWN PUSHBUTTON RELEASED
THEN ISSUE VERTICAL STOP

IF ROLL CCW PUSHBUTTON PRESSED
THEN ISSUE ROLL MOVE CCW, FIXED, SMALL
IF ROLL PUSHBUTTON RELEASED
THEN ISSUE ROLL STOP

IF ROLL CW PUSHBUTTON PRESSED
THEN ISSUE ROLL MOVE CW, FIXED SMALL
IF ROLL CW PUSHBUTTON RELEASED
THEN ISSUE ROLL STOP

FIG. 29

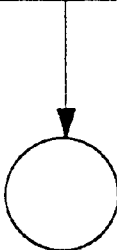 RETURN

SUBROUTINE FILE 18
COARSE ROLL MOVES
FROM PUSHBUTTONS

IF ROLL CW PUSHBUTTON PRESSED
AND ROLL INCLINOMETER IS LESS THAN 195 DEG.
THEN ISSUE ROLL MOVE, CW, CONTINUOUS, SLOW
START 2 SECOND TIMER
IF ROLL CW PUSHBUTTON PRESSED
AND 2 SECOND TIMER DONE
THEN ISSUE ROLL MOVE CW, CONTINUOUS, FAST

IF ROLL CW PUSHBUTTON RELEASED
OR IF ROLL INCLINOMETER ANGLE >=195 DEGREES
THEN ISSUE ROLL STOP

IF ROLL CCW PUSHBUTTON PRESSED
AND ROLL INCLINOMETER >=-5 DEGEREES
THEN ISSUE ROLL MOVE CCW, CONTINUOUS, SLOW
START 2 SECOND TIMER
IF ROLL CCW PUSHBUTTON PRESSED
AND W SECOND TIMER DONE
THEN ISSUE ROLL MOVE CCW, CONTINUOUS, FAST

IF ROLL CCW PUSHBUTTON RELEASED
OR IF ROLL INCLINOMETER ANGLE <=-5 DEGREES
THEN ISSUE ROLL STOP

RETURN

FIG. 30

METHOD AND APPARATUS FOR AUTOMATED DOCKING OF A TEST HEAD TO A DEVICE HANDLER

This application is a division of U.S. patent application Ser. No. 08/355,501, filed on Dec. 12, 1994, now U.S. Pat. No. 5,600,258, which is a continuation-in-part of U.S. patent application Ser. No. 08/122,055, filed Sep. 15, 1993, now U.S. Pat. No. 5,440,943.

A microfiche Appendix is included in this application containing 1 microfiche. The microfiche contains 93 frames plus one test target frame for a total of 94 frames.

A portion of this patent document contains material which is subject to copyright protection. The owner has no objection to the facsimile reproduction by anyone of the patent document or patent disclosure as it appears in the Patent and Office patent file or records, but otherwise reserves all rights whatsoever.

FIELD OF THE INVENTION

This invention relates to the field of art of electronic test head positioners.

BACKGROUND OF THE INVENTION

In the automatic testing of integrated circuits (IC) and other electronic devices, special device handlers have been used which bring the device to the proper temperature and place the device to be tested in position. The electronic testing itself is provided by a large and expensive automatic testing system which includes a test head which has been required to connect to and dock with the device handler. In such testing systems, the test head has usually been very heavy—on the order of 40 to 300 kilograms. The reason for this heaviness is that the test head uses precision high frequency control and data signals so that the electronic circuits may be located as close as possible to the device under test. Accordingly, the test head has been densely packaged with electronic circuits in order to achieve the accurate high speed testing of the sophisticated devices.

Test head positioner systems may be used to position the test head with respect to the device handler. When the test head is accurately in position with respect to the device handler, the test head and the device handler are said to be aligned. When the test head and device handler are aligned, the fragile test head and device handler electrical connectors can be brought together (i.e. docked), enabling the transfer of test signals between the test head and the device handler. Prior to docking, the fragile test head and device handler electrical connectors must be precisely aligned to avoid damaging the fragile electrical connectors.

A positioner, able to move along a support structure, carries the test head to the desired location at which the test head is positioned to connect to and dock with the device handler. The test head is attached to the positioners so that the test head can achieve up to six degrees of motion freedom (X, Y, Z, θX, θY, θZ).

Test heads, and their respective positioners, are often used in an ultraclean room environment. However, ultraclean room environments are often extremely expensive to provide. Thus, the useable space within an ultraclean environment is only available at a premium.

A variety of test head manipulators are currently available for use in ultraclean room environments. Although some of these test head manipulators have a variety of desirable features, the amount of space which each of these test head manipulators requires for proper operation may be undesirable.

As device testing in general, and the use of test heads and device handlers in particular becomes developed to handle ever more increasingly complex tasks, test heads continue to get larger and larger. This increase relates both to the physical size and weight of the test head. However, as test heads get larger and larger, fully manual, fully balanced methods become ever more difficult to actually implement in hardware.

SUMMARY OF THE INVENTION

A positioner facilitates docking and undocking of an electronic test head with a device handler. The positioner provides for rotation of the test head about a first axis. The positioner includes a linkage arm structure for moving the test head along a second axis orthogonal to the first axis. Using motors, sensors and a processor, the linkage arm structure accurately docks the electronic test head with the device handler.

BRIEF DESCRIPTION OF THE DRAWINGS

FIG. 5 is a further perspective drawing which illustrates an exemplary embodiment of the present invention.

FIGS. 6b and 6c are side views of the cradle support shown in FIG. 6a.

FIG. 8 illustrates the Y-drive assemble according to an exemplary embodiment of the present invention.

FIGS. 15–30 are flow chart diagrams which explain operation of the processor system.

FIGS. 31a–c illustrate alternative embodiments of the present invention.

OVERVIEW

Figure 1:
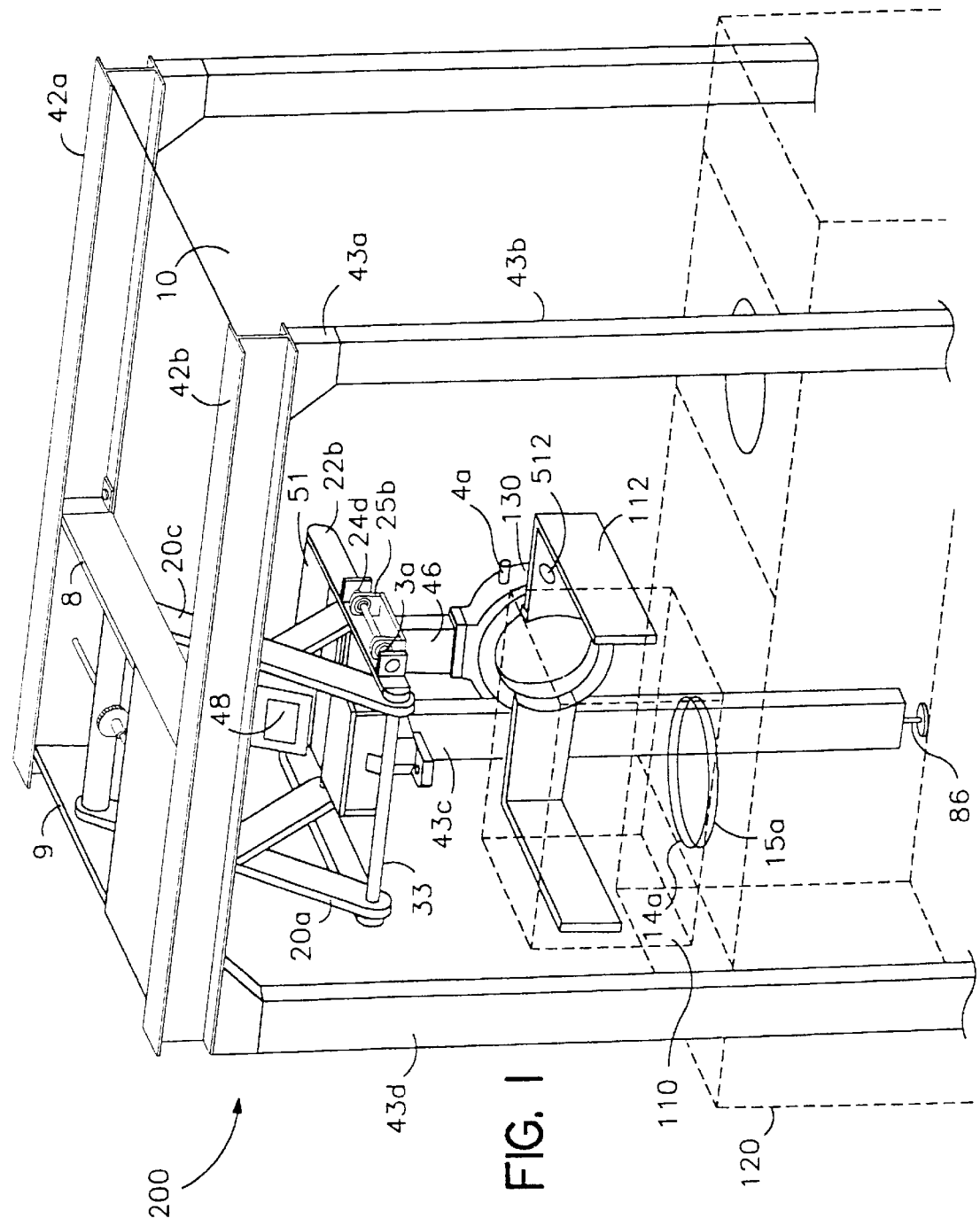
FIG. 1 is a perspective drawing which illustrates an exemplary embodiment of the present invention.

The present invention relates to a positioner system 200 for automatically docking an electronic test head 110 with respect to an integrated circuit handler 120. When test head 110 and device handler 120 are docked, the very fragile contacts 14 located on test head 110 are very precisely aligned and mated with connectors 15 on device handler 120. Positioner system 200 moves the test head 110 under motor control with precise movements to mate contacts 14 and connectors 15. Furthermore, various positional sensors (described below) ensure that contacts 14 and connectors 15 are not misaligned prior to being mated.

Figure 3:
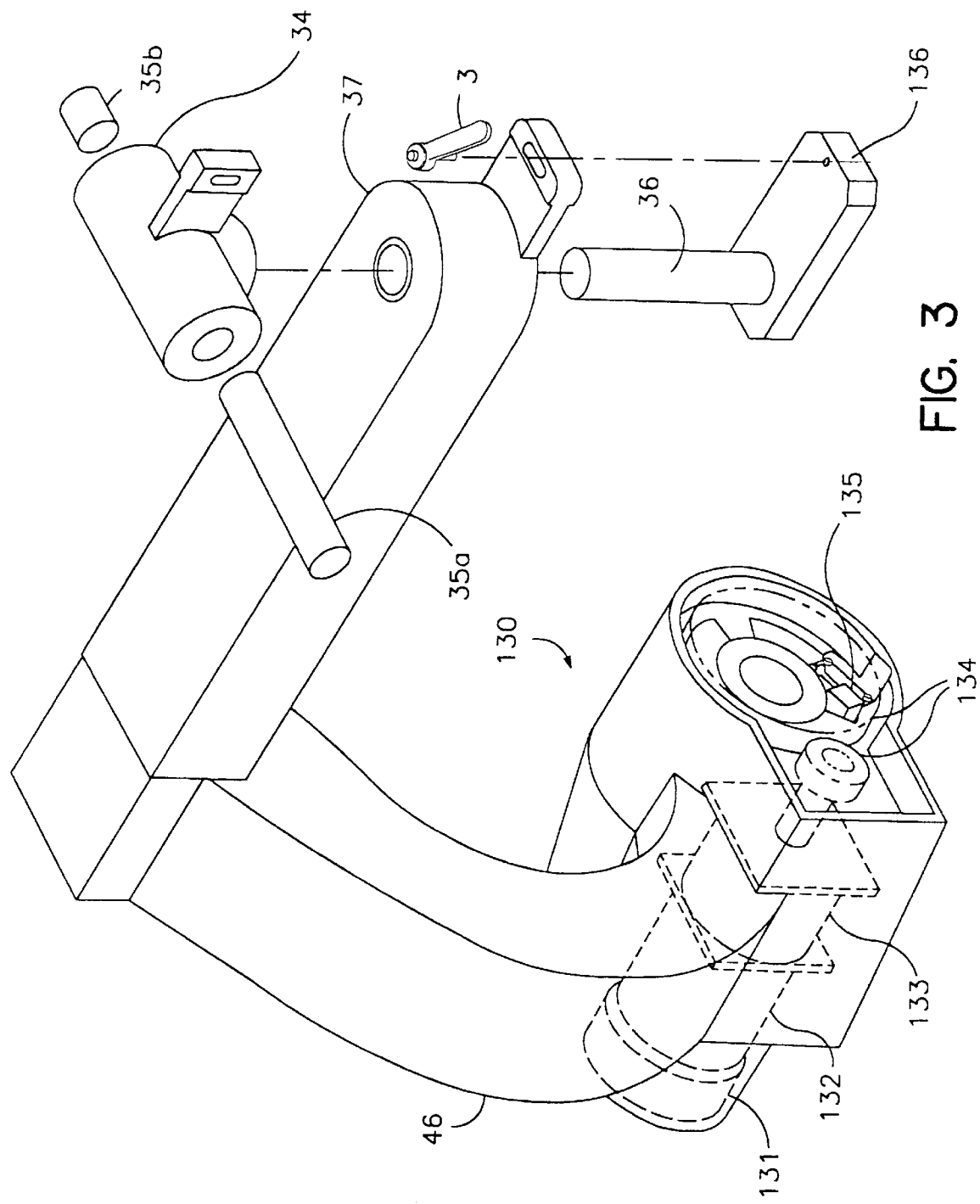
FIG. 3 is a perspective drawing which illustrates coupling between a cradle back (which provides roll motion) and a carriage base.
Figure 7A:
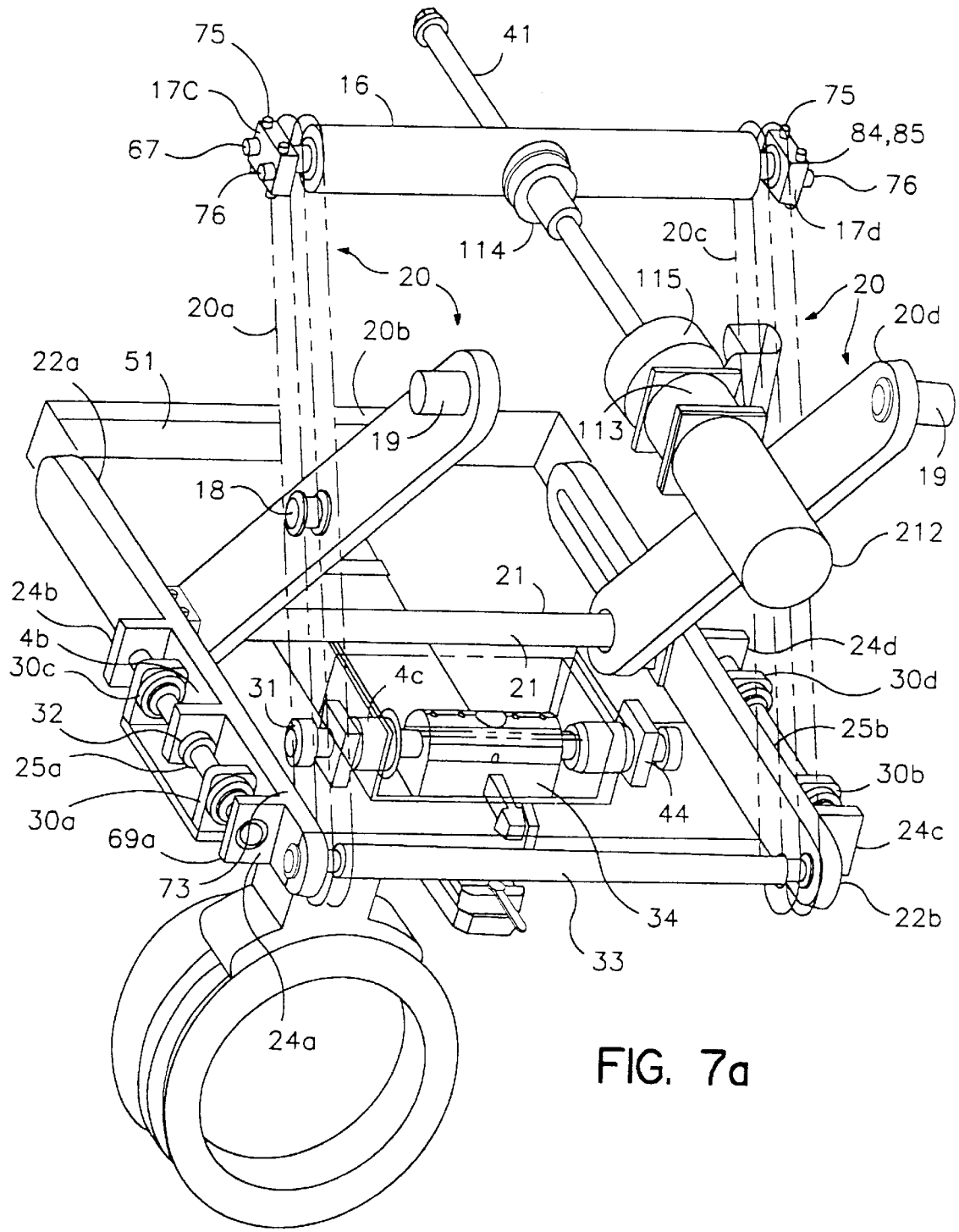
FIG. 7a is a perspective view of an exemplary embodiment of the present invention.
Figure 31A:
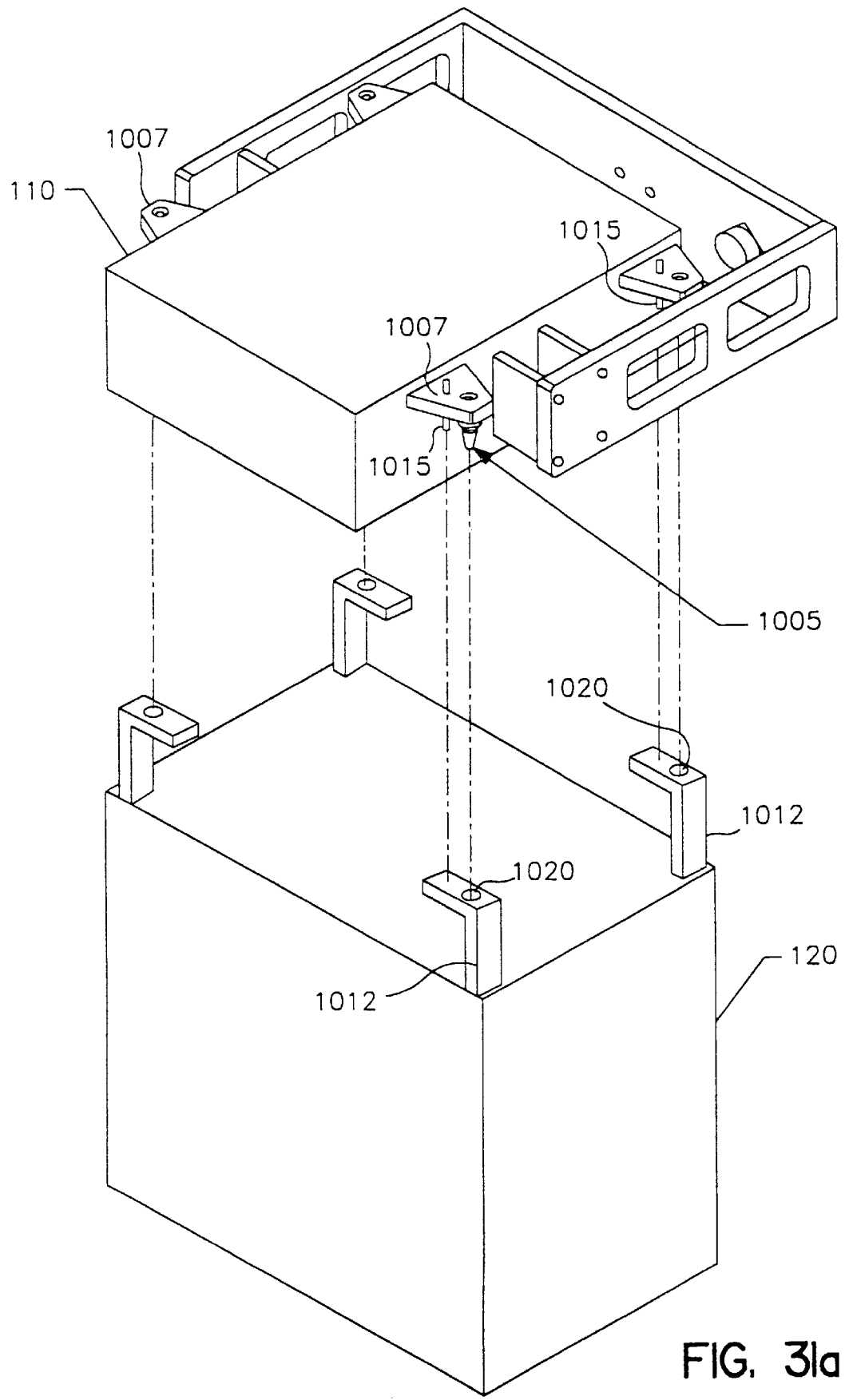
Figure 3L:
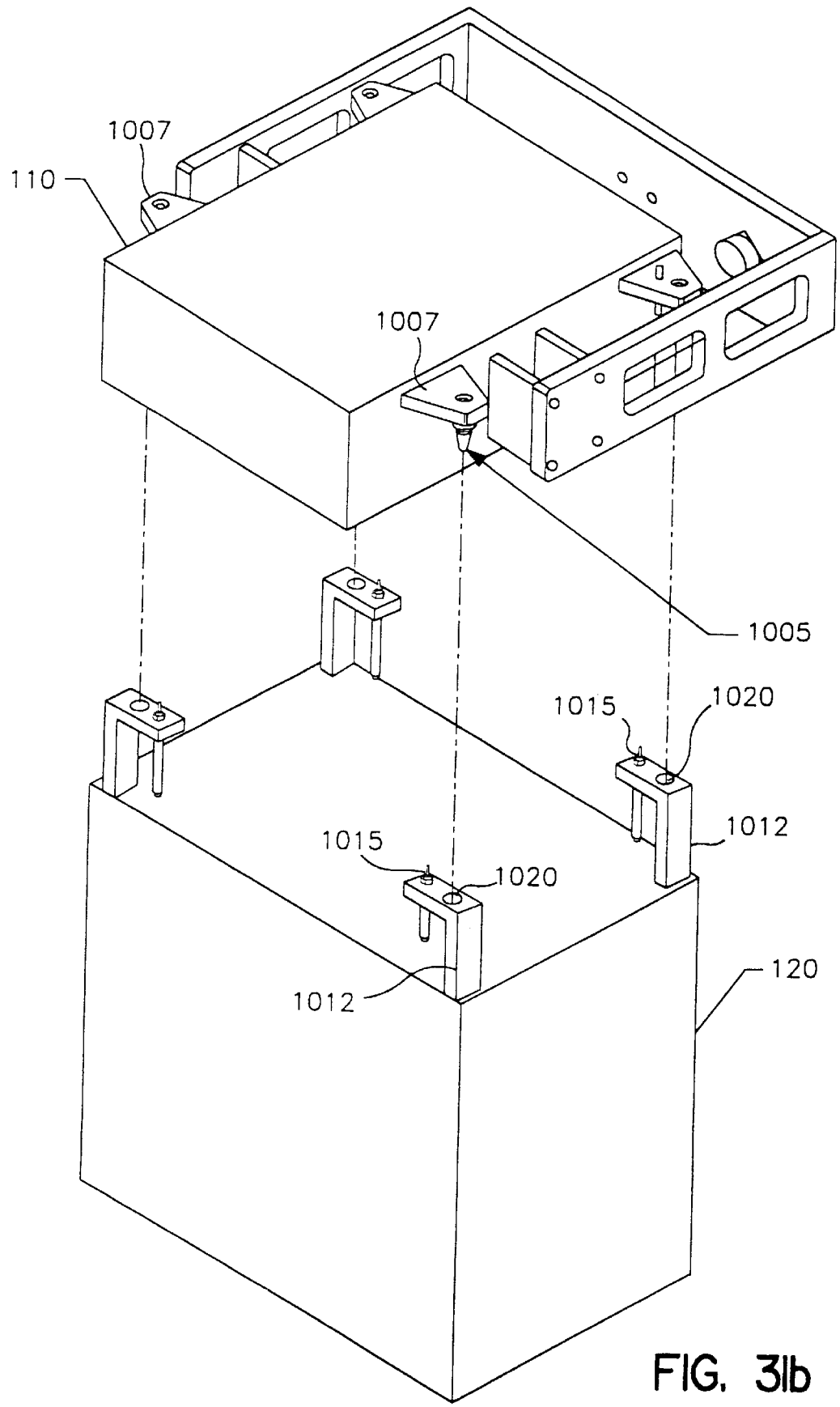

As shown for example by FIG. 1, test head 110 (shown in phantom) is coupled to cradle 112. Inclinometer 512 provides signals which indicate the position of test head 110 about the Y axis (see FIG. 31). Cradle 112 is coupled to test head drive assembly 130. As shown in FIG. 3, test head drive assembly 130 includes stepper motor 132 which rotates cradle 112 about the Y axis. Support member 46 couples test head drive assembly 130 to swing arm 37. Wrist shaft 36 extends through an opening in swing arm 37 and engages wrist block 34 (and enables movement about the Z axis). As shown in FIG. 5, side to side shafts 35a,b extend through openings in carriage base 26 to enable movement along and about the X axis. As shown in FIG. 7a, carriage base 26 slides along in-out shafts 25a, 25b for movement along the Y axis. In-out shafts 25a, 25b are coupled to carriage rails 22a, 22b. Carriage rails 22a, 22b are situated at the bottom of linkage arms 20. Linkage arms 20 each form a scissor shaped member. As motor 212 rotates ball screw 41, the top portion of linkage arm structures 20a, 20c are moved either towards or away from the top portion of linkage arm structures 20b, 20d. This results in carriage rails 22a, b moving upward and downward as the bottoms of linkage arm structures 20 swing upward and downward (by virtue of the tops of linkage arm structures 20 moving towards and away from each other). Test head 110 is thus moves upward and downward.

Figure 9:
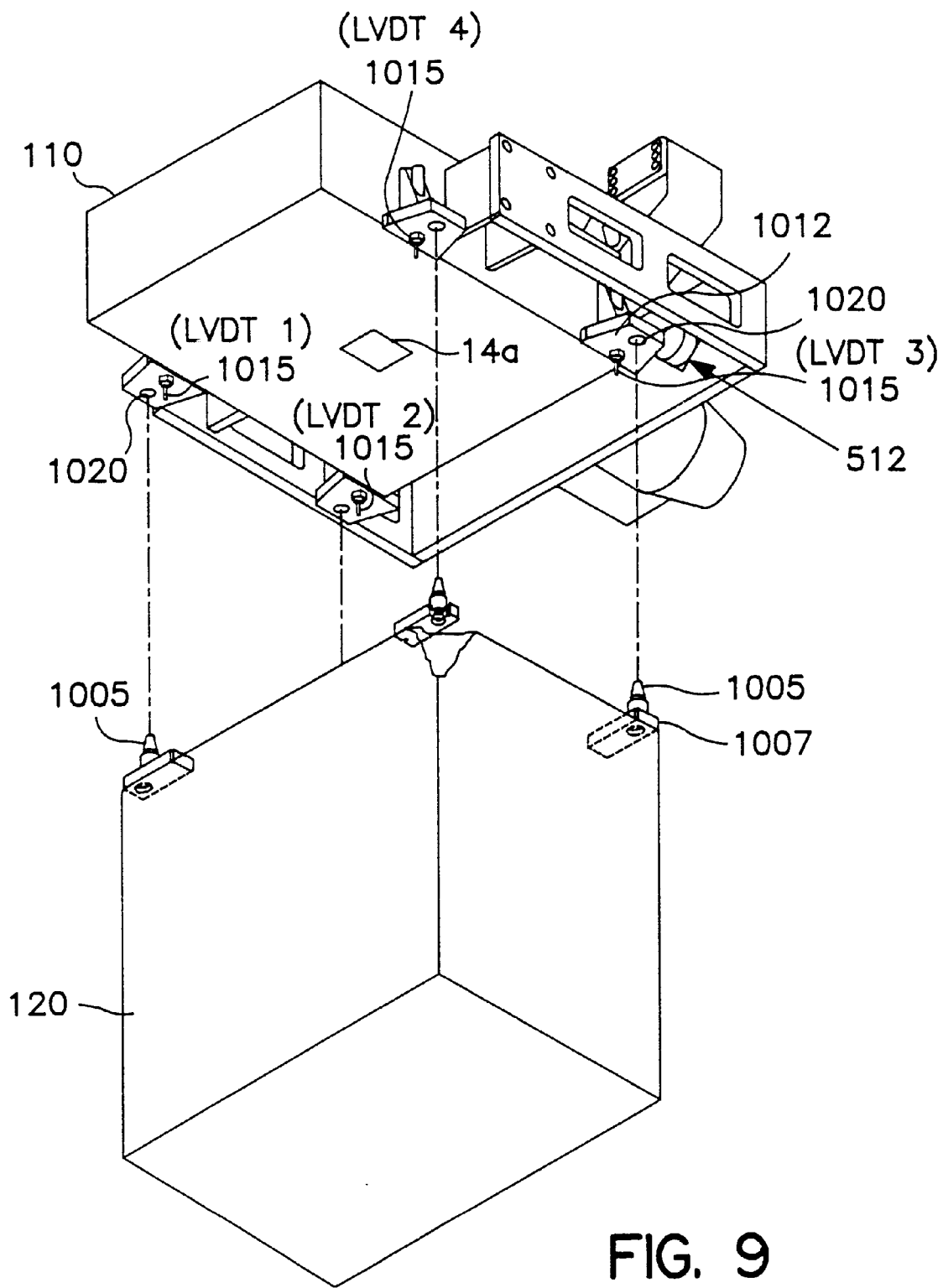
FIG. 9 is a perspective drawing which illustrates docking of a test head to a device handler in accordance with an exemplary embodiment of the present invention. The perspective drawing provides a view from the bottom of the test head and the device handler.

As shown in FIG. 9, protection plates 1012 are attached to test head 110. When alignment holes 1020 formed in protection plates 1012 receive alignment pins 1005 attached to device handler 120, test head 110 is properly aligned with device handler 120. Test head 110 and device handler 120 may then be docked without destroying contacts 14 included in test head 110.

Linear Variable Distance Transducers (LVDTs) 1015 are also attached to protection plates 1012. As test head 110 is moved towards device handler 120, the sensory "pin" extending from each LVDT is compressed inwards. Each LVDT then generates a signal indicating the distance by which each sensory pin is compressed.

Figure 13A:
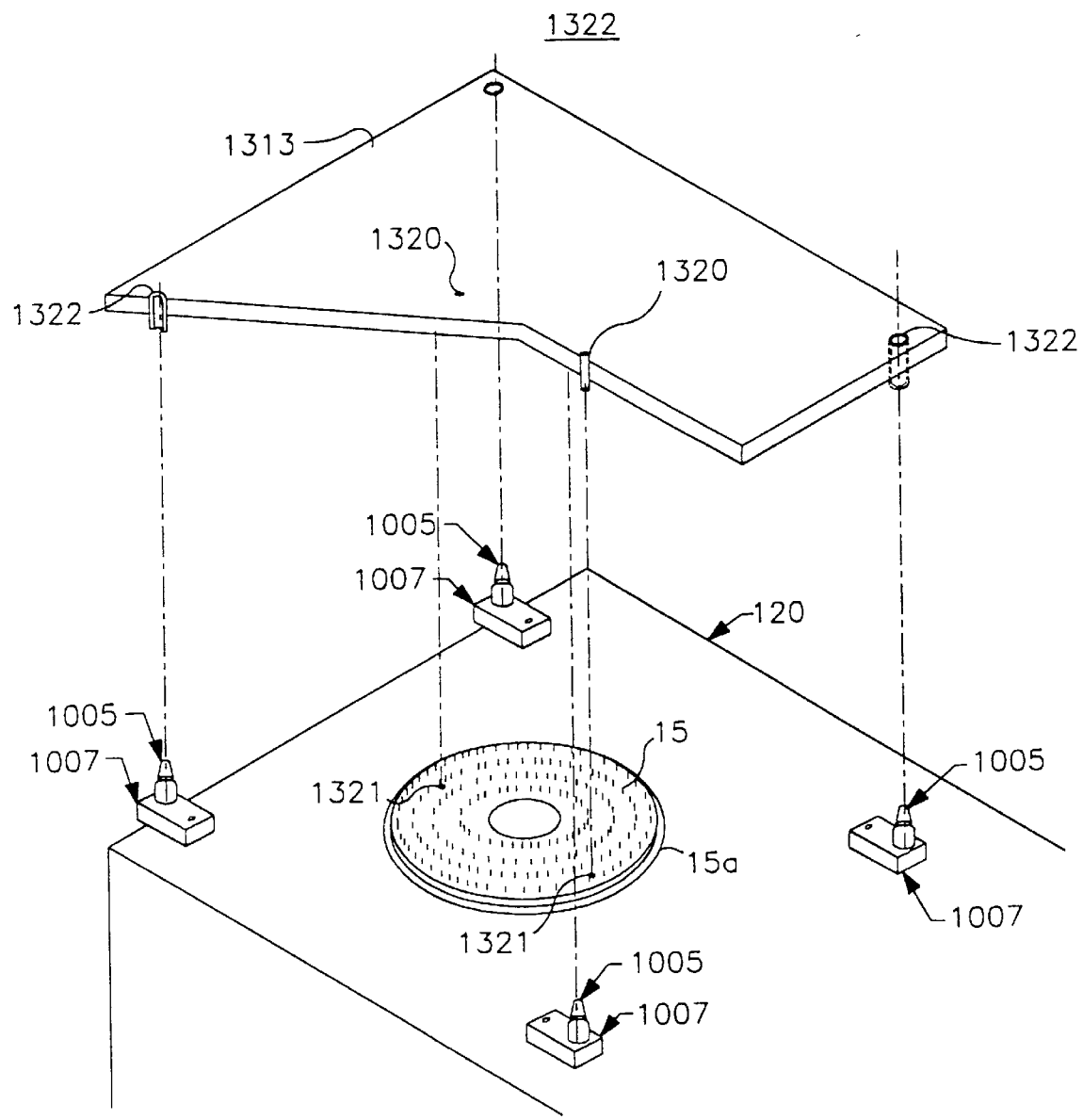
FIGS. 13a and 13b are perspective drawings which illustrate calibration of alignment structures with regard to the device handler and the test head, respectively.

During installation (before test head 110 is ever docked to device handler 120) calibration fixtures 1313, 1314 (see FIGS. 13a, b) are used to precisely align alignment pins 1005 and alignment holes 1020 with regard to each other and with regard to contacts 14 and connectors 15. Each calibration fixture is first positioned relative to a mechanical target on the respective test head 110 and device handler 120. Alignment pins 1005 and alignment holes are then positioned relative to alignment structures formed in the calibration fixtures. Each LVDT is then situated so that each LVDT's sensory pin is compressed inwards until each LVDT provides a predetermined reading. This reading is defined to correspond to test head 110 and device handler 120 being relatively positioned to barely achieve contact between contacts 14 and connectors 15.

Test head 110 and device handler 120 are then brought together (i.e. using motorized or manual motion from positioner system 200) so that alignment holes 1020 receive alignment pins 1005 and each LVDT generates the predetermined reading described above. The non-motorized degrees of freedom of positioner system 200 are fixed. Test head 110 is then moved by motor towards device handler 120 a predetermined distance as indicated by the LVDTs to achieve, for example, desired insertion distance of contacts 14 in connectors 15 (or if contact 14 is a spring type pogo pin, desired distance of compression of contact 14). The signals generated by the LVDTs are then stored.

During automated motorized docking, the initial position of the test head is determined from the signals generated by inclinometers 510, 512. After test head 110 is lowered by motor 212 so as to be close enough to device handler 120 for the LVDTs to register, the LVDT signals are used to accurately determine the position of test head 110 relative to device handler 120. If test head 110 is not properly aligned about the Y axis with device handler 120 prior to docking, the signals generated by the LVDTs will so indicate. Motor 132 can then be actuated until prior alignment is achieved and test head 110 and device handler 120 may then be docked.

DETAILED DESCRIPTION OF THE INVENTION

Figure 33:
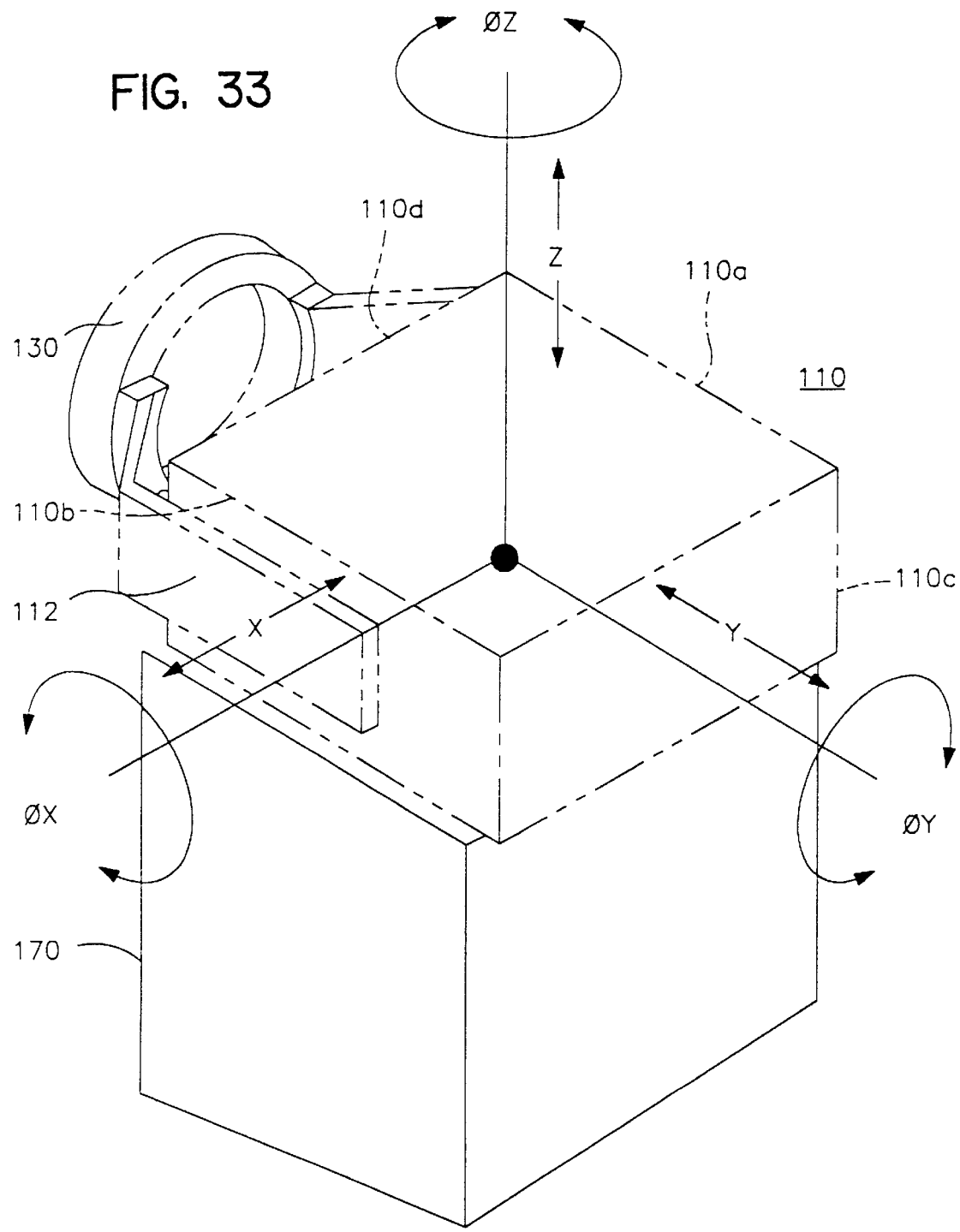
FIG. 33 diagrammatically shows the six degrees of freedom of the system shown for example in FIGS. 1, 4 and 5.

Referring now to FIG. 1, there is shown a test head positioner system 200 in accordance with an exemplary embodiment of the present invention. As shown, positioner system 200 carries a test head 110 with contacts 14 for a test system for docking with connectors 15 of an integrated device (circuit) handler 120. Contacts 14 may be pogo pins (collapsible, spring-like pins) or static pins (e.g., as in a Hypertac connector arrangement). It will be understood that other electronic devices may be handled by the device handler, such as transistors, chips or dies, etc. In operation, positioner system 200 moves test head 110 accurately and precisely so that it may be docked to handler 120. Docking may be accomplished, for example, as more fully described in a previous patent by Smith (U.S. Pat. No. 4,705,447), herein incorporated by reference, and in a previous patent by Holt (U.S. Pat. No. 4,893,074), which is herein incorporated by reference. As will be described in detail, the position of test head 110 may be accurately manipulated to another position with six degrees of freedom X, Y, Z, θX, θY, θZ as shown in FIG. 33.

It is important for the proper installation of test head 110 that it have six degrees of freedom so that it can accurately be positioned with respect to handler 120. Furthermore, the motion of test head 110 can be restricted so that it automatically moves under motor control with only two degrees of motion (for example θY, Z). In this manner, test head 110 can be readily undocked and redocked with handler 120, so that maintenance of test head 110 can be performed.

In an exemplary embodiment of the present invention, test head 110 may be mounted via a yoke 112 to test head drive assembly 130. By use of test head drive assembly 130, test head 110 is able to rotate at least 180° about an axis which shall be defined as a Y axis. The ability of test head 110 to rotate about the Y axis facilitates maintenance of test head 110 as will be more fully described below.

Figure 2:
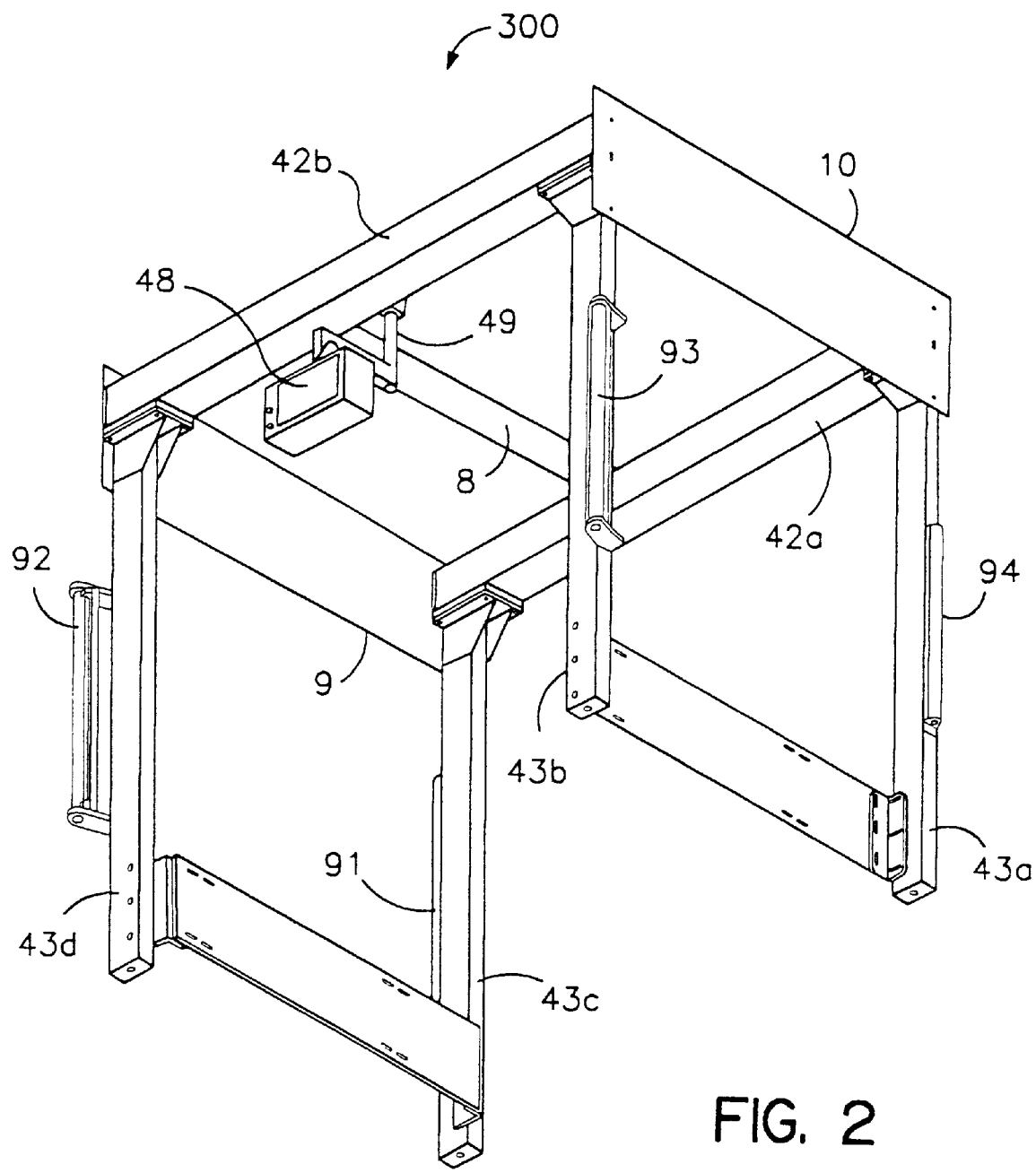
FIG. 2 is a perspective drawing which illustrates a gantry which forms a part of an exemplary embodiment of the present invention. The perspective drawing provides a view from the bottom of the gantry.

Positioner assembly 200 includes a gantry 300, the details of which are shown in FIG. 2. There are provided two beams 42a, 42b and two carriage rails 9, 10 forming the top of the gantry. Two legs 43b, 43d are attached to beam 42b at opposite ends so as to support beam 42b a predetermined distance from the floor. In addition, two legs 43a, 43c are disposed at opposite ends of beam 42a to support beam 42a at a predetermined distance from the floor. At the bottom of each leg 43a, 43b, 43c, 43d, a leveling pad (not shown) may be installed to facilitate leveling of the gantry. Alternatively, the gantry (without, for example, legs) could be suspended from the ceiling over the integrated circuit handler 120. An operator terminal 48 is also included. In an exemplary embodiment of the present invention, operator terminal 48 is model 550 manufactured by Allen Bradley Corporation. The operator terminal is coupled to beam 42b by hanger assembly 49.

A light curtain assembly is also included. The light curtain assembly includes (infrared light) transmitter 91, mirror assemblies 92, 93 and receiver 94. When the light beams generated by transmitter 91 and received by receiver 94 are interrupted, all motorized functions are stopped. In this manner, risk of injury to a worker by the motorized system is reduced.

As shown in FIG. 3, test head drive assembly 130 is coupled to support member 46. Support member 46 may be, for example, a rectangular beam or a goose neck as shown in FIG. 3 (depending upon the path of cables leaving the test head). Support member 46 may be coupled, in turn, to swing arm 37. Swing arm 37 is desirably of proper length so that when test head 110 is coupled to positioner system, test head 110 is in a balanced state (i.e. at its approximate center of gravity) with regard to the non-motorized degrees of freedom. Swing arm 37 is coupled to support member 46 at substantially right angles.

Test head drive assembly 130 comprises stepper motor 132, (electromagnetic) brake 131 attached thereto, gear box 133 with gears (not shown) being driven by stepper motor 132, helical gears 134 attached to and rotated by gear box 133 and limiting switch 135 attached to helical gears 134. In an exemplary embodiment of the present invention, motor 132 is model M111-FF-206E manufactured by Superior Electric Corporation.

Side-to-side shafts 35a, b are each coupled to wrist block 34 at respective openings. Thus, wrist block 34 is stationary relative to side-to-side shafts 35a, b. An additional opening is situated in the bottom of the wrist block 34. Wrist shaft 36 extends from the opening in the bottom of wrist block 34 through a further opening in swing arm 37. Wrist shaft 36 is coupled to wrist block 34. A flange 136 may be situated at the opposite end of wrist shaft 36 supporting swing arm 37. Wrist shaft 36 defines a Z axis. Swing arm 37 rotates about the Z axis by rotating relative to wrist shaft 36. Thrust bearing 80 (not shown), situated between the flange of wrist shaft 36 and swing arm 37 facilitates rotation of swing arm 37. Movement of swing arm 37 about the Z axis may be prevented by actuating lock wrench 3.

Wrist shaft 36 is coupled to carriage base 26. Coupling between wrist shaft 36 and carriage base 26 is illustrated by FIG. 4.

Figure 4:
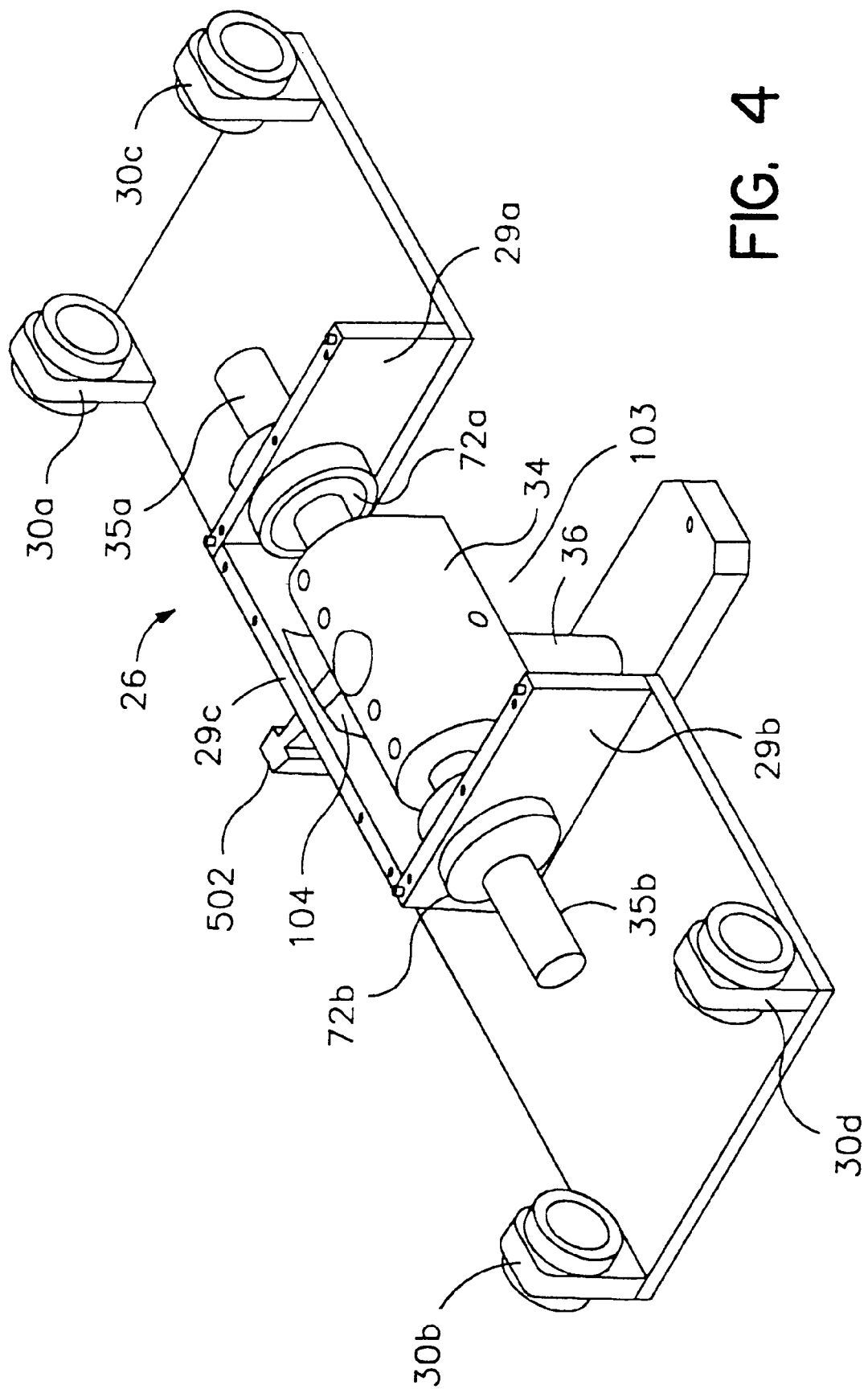
FIG. 4 is a perspective drawing which illustrates coupling between a swing arm and a carriage base.

As shown in FIG. 4, carriage base 26 includes rectangular opening 103 and rectangular opening 104. Wrist shaft 36 extends between wrist block 34 and swing arm 37 by going through rectangular opening 103. Extension member 502 (extending from wrist block 34) extends through rectangular opening carriage walls 29a, 29b, 29c, 29d (not shown) which may be an integrally formed part of carriage base 26 are situated about rectangular opening 103. Carriage ceiling 29e (not shown) may be situated on top of carriage walls 29a–d to form a partially enclosed space. Side-to-side shaft 35a extends through carriage wall 29a. Similarly, side-to-side shaft 35b extends through carriage wall 29b.

Side-to-side shafts 35a, 35b, define an X axis. Thus, wrist block 34 is able to move along the X axis by the sliding motion of side-to-side shafts 35a, 35b. Wrist block 34 is also able to move about the X-axis defined by side-to-side shafts 35a, b. Movement of wrist block 34 both along and about the X-axis is facilitated by bearings 72a, 72b which may be situated, for example, adjacent to carriage walls 29a, 29b respectively.

As shown in FIG. 5, extension member 502 extends outwardly from wrist block 34. Extension member 502 extends through opening 104 and is coupled to lock collar 508. Lock screw 503 couples together extension member 502 and lock collar 508. As previously stated, test head 110 is capable of rotating about the X axis defined by side-to-side shafts 35a, 35b. Movement of test head 110 about the X axis may be prevented by actuating lock wrench 503.

Lock collar 508 is also used for preventing movement of test head 110 along the X axis. As previously stated, wrist block 34 is able to move along the X axis by side-to-side shafts 35a, 35b. Lock wrench 512 extends from the bottom of carriage base 26, through a slot formed in carriage base 26, and into lock collar 508. When lock wrench 512 is not actuated, movement of lock collar 508 with wrist block 34 (and hence test head 110) along the X axis is facilitated by cam follower 514 (which is mounted onto lock collar 508) sliding along cam follower receptacle 518 (which is mounted onto the top surface of carriage base 26). Movement of test head 110 along the X axis may be prevented by actuating lock wrench 512.

Figure 6A:
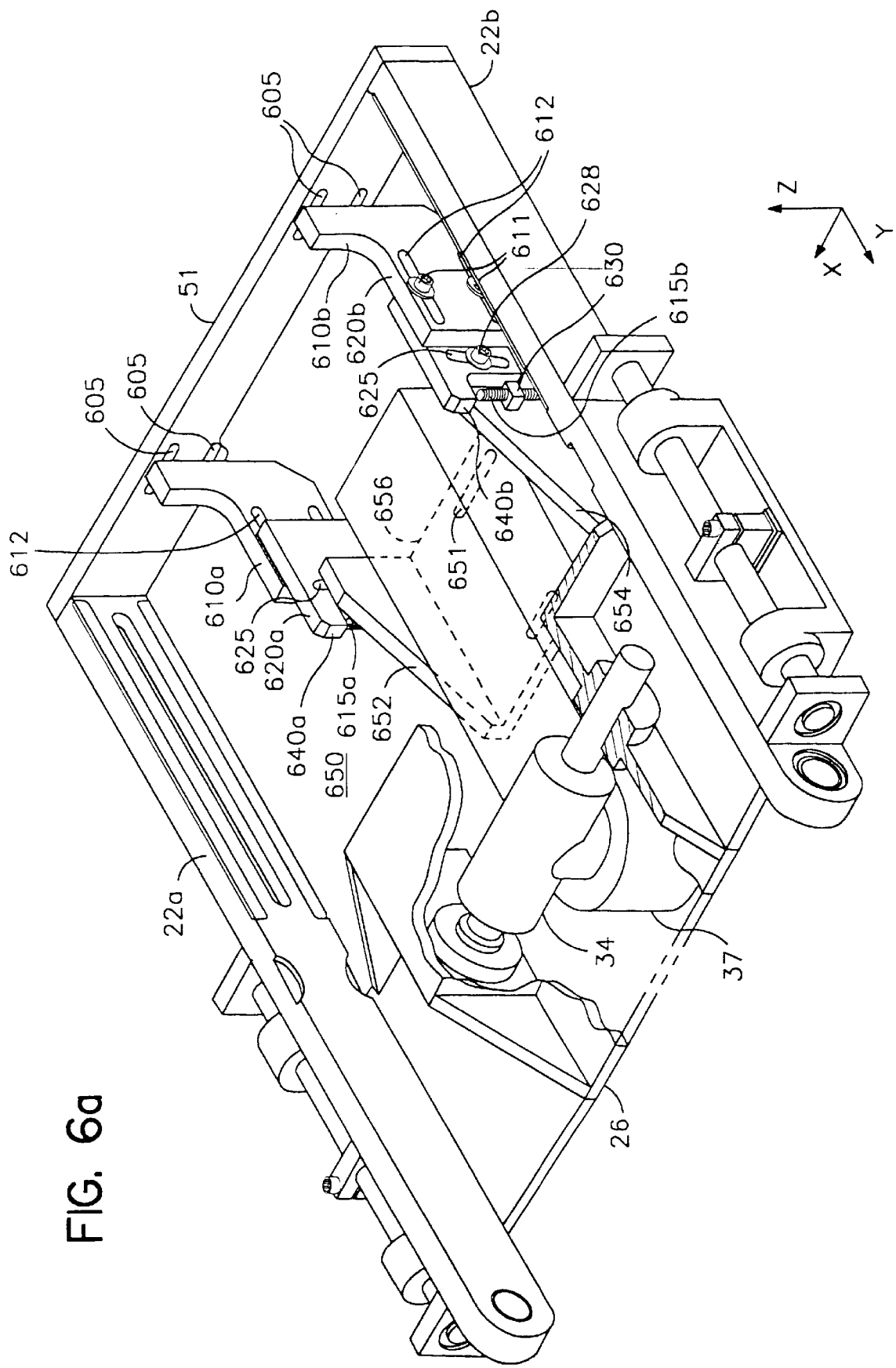
FIG. 6a is a perspective drawing which illustrates coupling between a swing arm support in accordance with a further exemplary embodiment of the present invention.

FIG. 6a illustrates an alternative embodiment of the present invention. Y translation lock brackets 610a, 610b are coupled to horizontal rail 51 through appropriate fasteners (not shown) which extend into Y translation lock brackets 610a, 610b through slots 605 formed in horizontal rail 51 (described in more detail with regard to FIG. 7a). Rear brackets 610a, 610b are capable of moving along respective slots 605 and are then fastened securely into place. θX lock bracket 620a is coupled to Y translation lock bracket 610a through an appropriate fastener (not shown) which extends into θX lock bracket 620a through slots 612 formed in Y translation lock bracket 610a. Similarly, θX lock bracket 620b is coupled to Y translation lock bracket 610b through fastener 628. θZ lock member 650 includes side portions 652, 654 and bottom portion 656. Side portion 652 is coupled to θX lock bracket 620a by fastener (not shown) which extends through a slot formed in θX lock bracket 620a. Side portion 654 is coupled to θX lock bracket 620b by fastener 628 which extends through a slot formed in θX lock bracket 620b. Swing arm 37 rests on bottom portion 656. Fasteners (not shown) extend from the bottom of bottom portion 656, through slots 651 in bottom portion 656 and into swing arm 37. Swing arm 37 is coupled to spindle block 34 and to the test head drive assembly 130 as described in the text which refers to FIG. 3.

Pitch adjust screws 615a, b extend through threaded openings in extension members 630 which are attached to and project from side portions 652, 654. The bottom end of pitch adjust screws 615a, b make contact with the bottom surfaces of projections 640a, b extending from θX lock brackets 620a, b.

The various components described above are capable of various types of movements relative to each other. These various movements cause swing arm 37 to move. The movement of swing arm 37 in turn causes test head 110 to move. In this manner, test head 110 can be aligned with device handler 120 for proper docking and undocking of test head 110 to device handler 120. For example, loosening bolts extending through openings 605 enables movement of test 110 along the X axis. Loosening bolts 612 enables movement of test head 110 along the Y axis. Loosening bolts 630 and actuating pitch adjust screws 615 a, b results in motion of test head 110 about the X axis (as shafts 35a, b pivot within bearings 72a, b). Loosening bolts extending through slots 651 and into swing arm 37 results in enabling motion of test head 110 about the Z axis (as swing arm 37 rotates about wrist shaft 36).

FIGS. 6b and 6c illustrate how swing arm 37 pivots about the X axis as pitch adjust screws 615a, b are actuated. FIG. 6b illustrates pitch adjust screw 615a extending as far as possible through extension member 630. Because of the relatively large distance between extension member 630 and the bottom surface of projection 640a, the rear of swing arm 37 tilts downwards and the front of swing arm 37 tilts upwards. Because test head 110 is coupled to the front portion swing arm 37, test head 110 tilts upwards (i.e., pivots upwards or counterclockwise to the position shown in FIG. 6b). FIG. 6c illustrates pitch adjust screw 615a extending as little as possible through extension member 630. Because of the relatively small distance between extension member 630 and the bottom surface of projection 640a, the rear of swing arm 37 tilts upwards and the from the swing arm 37 tilts downwards. Test head 110 thus tilts downwards (i.e., pivots downwards or clockwise to the position shown in FIG. 6c).

As shown in FIG. 7a, bearing blocks 30a, 30b, 30c, 30d (included in carriage base 26) enables carriage base 26 to be coupled to carriage rails 22a, b. Specifically, pillow blocks 24a, b are coupled to carriage rail 22a by each extending from the surface of carriage rail 22a. Similarly, pillow blocks 24c, d are coupled to carriage rail 22b by each extending from the surface of carriage rail 22b. In-out shaft 25a extends from pillow block 24a to pillow block 24b and is held in position by retaining rings 69a, 69b (not shown). In-out shaft 25b extends from pillow block 24c to pillow block 24d and is held in position by retaining rings 69c, 69d (not shown). In-out shaft 25a extends through lock collar 32 which is also coupled to carriage base 26. Carriage rails 22a, 22b are coupled together by horizontal rail 51.

In-out shafts 25a, b each define a Y axis. Thus, carriage base 26 is capable of moving along the Y axis as a result of bearing blocks 30a, b, c, d sliding along in-out shafts 25a, b. The Y axis movement is facilitated by bearings 79 mounted in bearing blocks 30a, b, c, d. Movement of carriage base 26 along the Y axis may be prevented by actuating clamping knob 4b, shown coupled to lock collar 32.

As shown in FIG. 7a, linkage arm 20 (shown to the left in the figures) includes linkage arm structure 20a and linkage arm structure 20b. Linkage arm 20 (shown to the right in the figures) includes linkage arm structure 20c and linkage arm structure 20d. Linkage axle 33 includes ends of diminished diameter which extend through openings in linkage arm structures 20a, 20c and is coupled to carriage rails 22a, 22b. In this way, linkage arm structures 20a, 20c are coupled to carriage rails 22a, 22b.

Figure 7B:
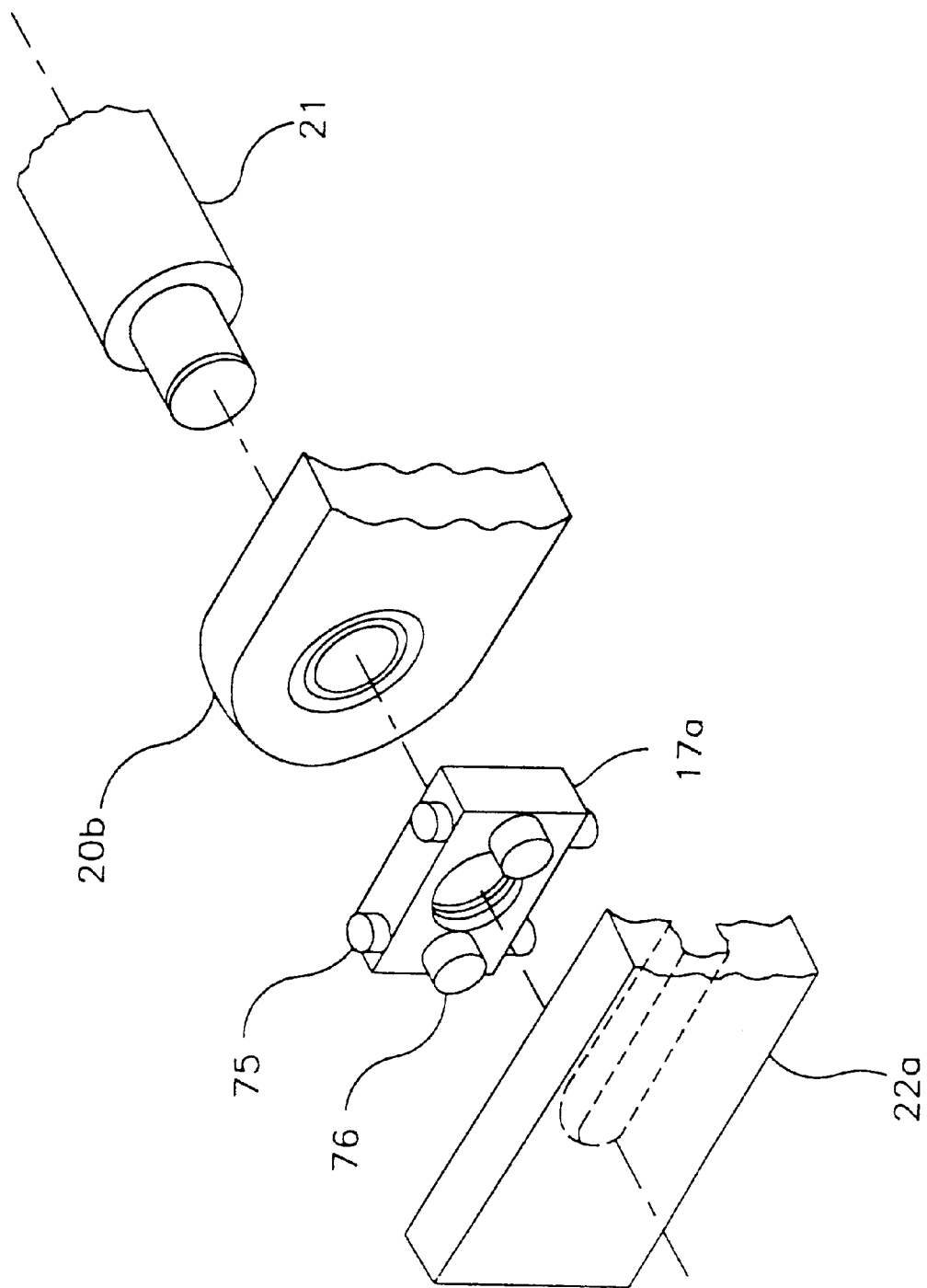
FIG. 7b is an exploded perspective drawing which illustrates coupling between a linkage arm structure and a carriage rail.

Linkage axle 21 also includes ends of diminished diameter. This is more clearly shown in FIG. 7b. One end of linkage axle 21 extends through an opening near the bottom of arm component 20b, and through a further opening in trolley 17a. A similar configuration may be found on the opposite end of linkage axle 21 which extends through an opening in linkage arm structure 20d, and through an opening in a further trolley 17b (not shown). Each trolley 17a, b includes cam followers 76 which engage the slots in carriage rails 22a, b and thrust bearings 75 which make contact with carriage rails 22a, b. Cam followers 75, 76 facilitate movement of trolleys 17a, 17b relative to carriage rails 22a, b. As the left-most and right-most linkage arms function and are coupled to the remaining apparatus similarly, the operation of linkage arm structures 20a, 20b only will be described.

Linkage arm structure 20a and linkage arm structure 20b are coupled together by pivot pin 18. Movement of linkage arm structure 20a relative to linkage arm structure 20b is facilitated by needle bearing 84 (not shown).

Linkage arm structure 20a is capable of a limited amount of rotation about linkage axle 33. Furthermore, linkage arm structure 20b is capable of a limited amount of rotation about linkage axle 21. This rotation is useful for vertical motion of test head 110 along the z axis as will be described later.

As shown in FIG. 8, motor 212 is included. In an exemplary embodiment of the present invention, motor 212 is model M113-FF-4011 manufactured by Superior Electric Corporation. Motor 212 rotates gear box 113. Rotation of gear box 113 may be selectively prevented by the actuation of brake 115. Gear box 113 rotates ball screw 41 (via shaft coupling 42). As ball screw 41 rotates, ball nut 114 moves along the axis defined by ball screw 41. Ball nut 114 is coupled to ball screw axle 16. As shown in FIG. 7a, ball screw axle 16 includes a shoulder at each end which projects through respective holes in linkage arm structures 20a, 20d and trolleys 17c, d. Trolleys 17c, d each include cam followers 76 which engage and move along respective tracks which are formed in carriage rail 9 and horizontal member 8 (shown in FIG. 1 between carriage rails 9, 10. Limit switches 80a,b mounted on the inner vertical surface of carriage rail 9 are used to detect whether trolley 17c has reached the track limits. Trolleys 17c, d each also include cam followers 75 which contact and facilitate movement relative to carriage rails 8, 9 as described below. Linkage arm structures 20b rotate about pivot pin 19. Each pivot pin 19 is fixed to horizontal member 8 and carriage rail 9, respectively. This rotation facilitates vertical movement of test head 110 along the z axis as described below.

Inclinometer 510 is attached to a vertical surface of linkage arm structure 20b. Inclinometer 512 is attached to a vertical surface of yoke 512 (see FIG. 1). In an exemplary embodiment of the present invention, inclinometers 510 and 512 are each Model A2-A-1, manufactured by U.S. Digital Corporation.

Vertical motion of test head 110 (i.e. motion along the Z axis) is accomplished as follows. As motor 212 turns, ball screw 41 also turns. This results in motion of ball nut 114 along the axis defined by ball screw 41. As ball nut 114 moves along the axis defined by ball screw 41, ball screw axle 16 (through trolleys 17c, 17d with cam followers 76) moves along horizontal member 8 and carriage rail 9. This, in turn, results in the movement of the top portion of linkage arm structures 20a, 20c along horizontal member 8 and carriage rail 9. As the upper portions of linkage arm structures 20a, 20c move along horizontal member 8 and carriage rail 9, the bottom portion of linkage arm structures 20a, 20c also moves. This motion of the bottom portion of linkage arm structures 20a, 20c is vertical. The vertical motion of linkage arm structures 20a, 20c results in the vertical movement of carriage rails 22a, 22b. As the front portion of carriage rails 22a, 22b moves vertically, the rear portion of carriage rails 22a, 22b also moves vertically. As carriage rails 22a, 22b move vertically, test head 110 moves vertically as well. Thus, the linkage arm structures 20a, b, c, d provide a lifting mechanism while at the same time determining the path of motion of test head 110.

Tilt of test head 110 (i.e., motion about the Y axis) is accomplished by engaging test head drive assembly 130. As motor 132 in test head drive assembly 130 rotates, yoke 112 (and hence test head 110) rotates about the Y axis.

Figure 10:
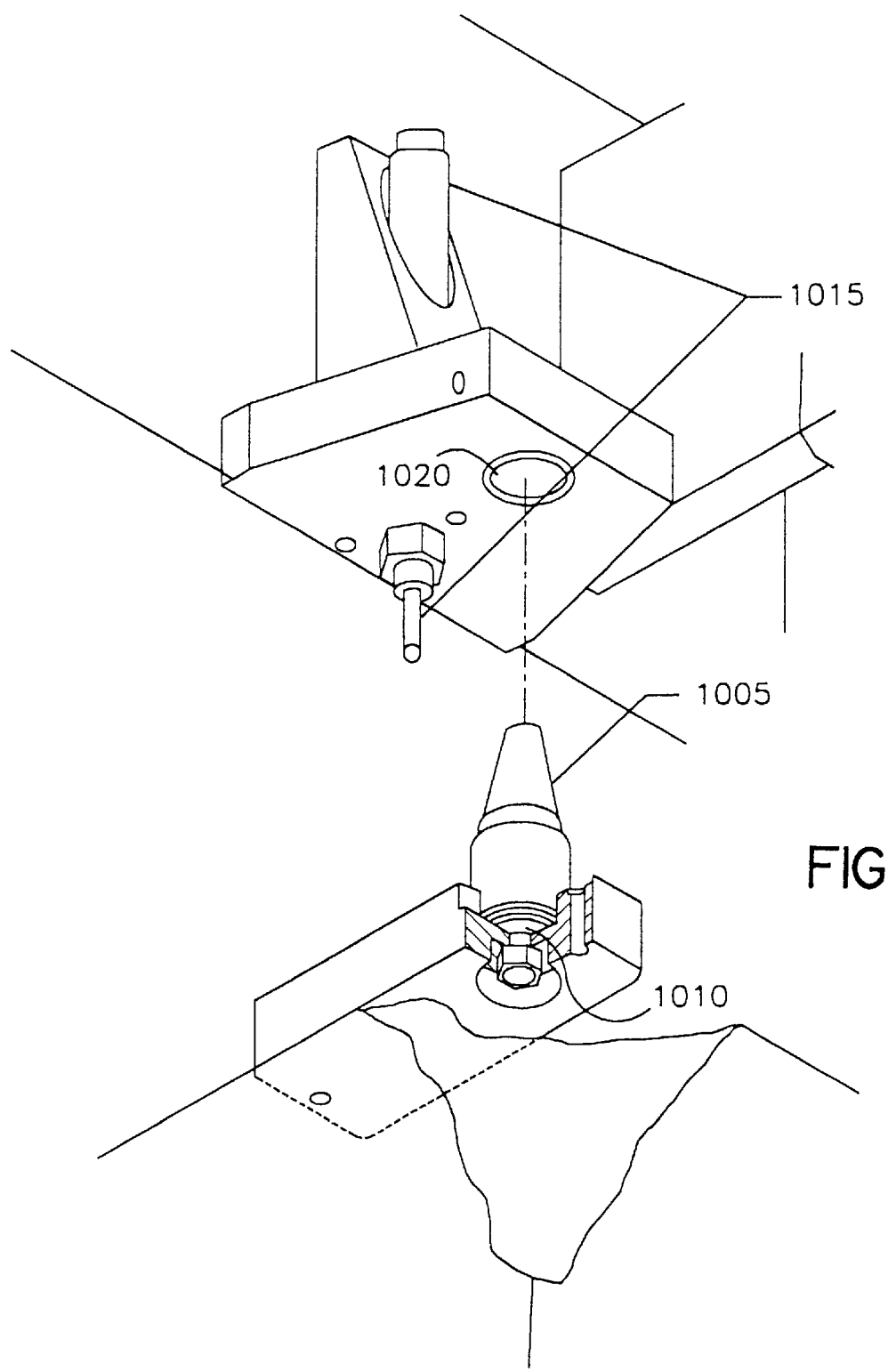
FIG. 10 is a perspective view which illustrates docking of the alignment pin on the device handler to the alignment hole in the protection plate on the test head.

FIGS. 9 and 10 illustrate docking of test head 110 to device handler 120. As shown in FIG. 9, docking is accomplished by test head 110 being moved (for example, downward) toward device handler 120 so that fragile electrical contacts 14 on test head 110 which are aligned by alignment pins 1005 and alignment holes 1020 make precise contact with connectors 15 on device handler 120.

Plural alignment pin bases 1007 are mounted on device handler 120 (for example, on the top surface of device handler 120). A respective alignment pin 1005 is mounted on the top surface of each alignment pin base 1007. Each alignment pin 1005 has a tapered upper end.

Plural protection plates 1012 are mounted on test head 110 (for example, adjacent to the contact side surface of test head 110). Each protection plate 1012 includes respective alignment hole 1020 which mates with respective alignment pin 1005.

Directly below each alignment pin 1005 is located respective load cell 1010. In an exemplary embodiment of the present invention, load cell 1010 is model ELF-TC-1000-250 manufactured by Entran Corporation. If test head 110 is being accurately docked with device handler 120, each alignment pin 1005 will be centered relative to respective alignment hole 1020. If alignment pin 1005 is not centered relative to respective alignment hole 1020 (indicating that test head 110 is not accurately aligned to device handler 120) load cell 1010 will indicate a load during docking. Thus, each load cell 1010 is provided as a safety precaution.

A respective Linear Variable Displacement Transducer (LVDT) 1015 is also coupled to each protection plate 1012. LVDTs 1015 are labelled LVDT1, LVDT2, LVDT3 and LVDT4 for case of identification. In an exemplary embodiment of the present invention, each LVDT 1015 is model GCD-121-250 manufactured by Schaevitz Corporation. As each LVDT 1015 makes contact with the respective alignment pin base 1007 and test head 110 is further lowered with respect to device handler 120, a spring loaded "pin" shown extending from the bottom of each LVDT 1015 is pressed into the interior of LVDT 1015. In other words, each LVDT 1015 is compressed. As each LVDT 1015 is compressed, each LVDT 1015 generates a signal indicative of the distance by which each LVDT 1015 is compressed (i.e. compression—distance). The distance by which each LVDT 1015 is compressed provides an indication of the distance between test head 110 and device handler 120 to guide precise docking.

Figure 13B:
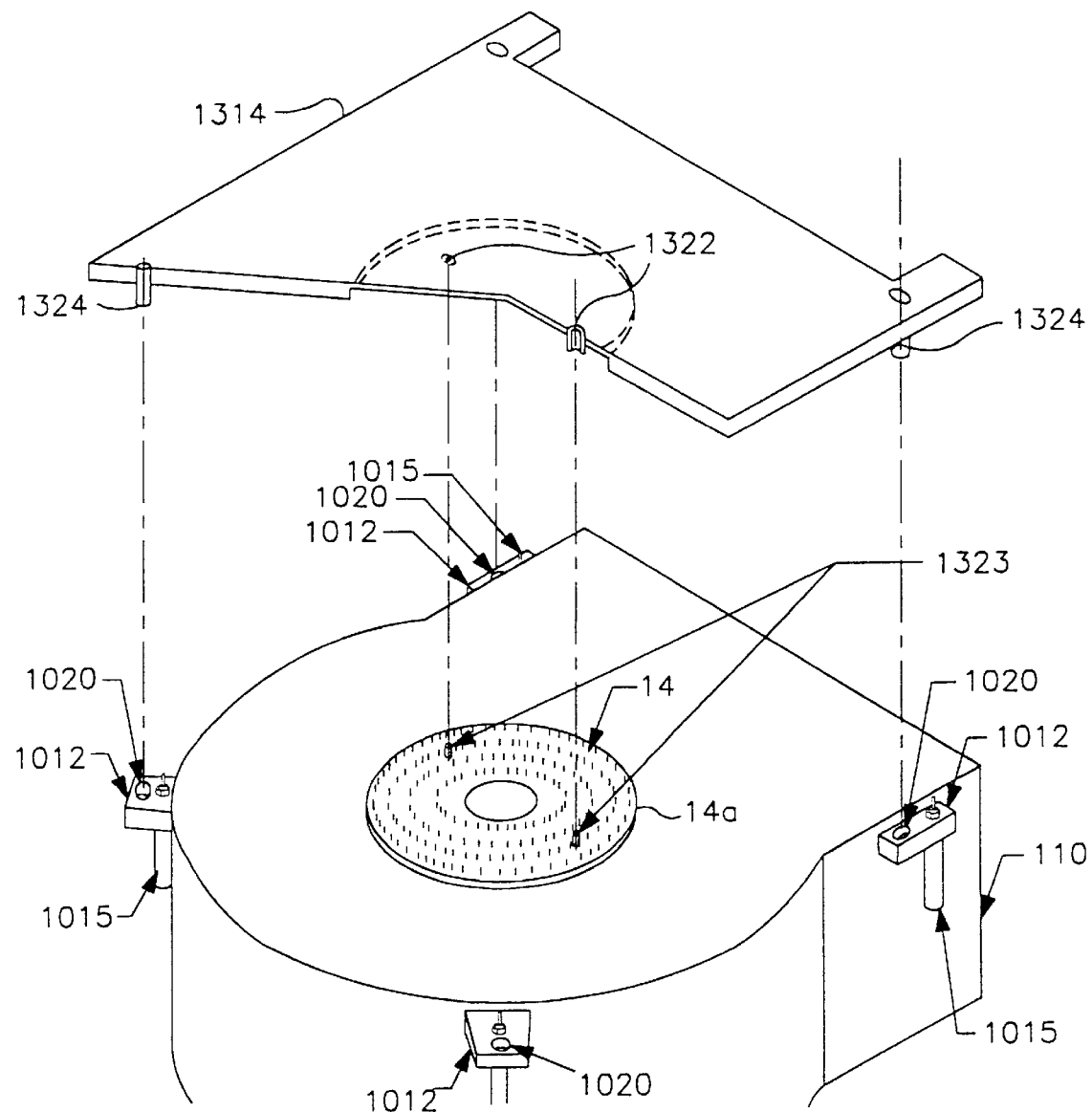

During the course of initial mechanical installation and before the test head 110 and device handler 120 are docked for the first time (i.e. before any programming or "teaching" of the electronics to perform automated docking of test head 110 to device handler 120 and before actual automated docking of test head 110 to device handler 120 for the first time), device handler calibration fixture 1314 (shown in FIG. 13a) and test head calibration fixture 1313 (shown in FIG. 13b) are used to calibrate alignment pins 1005 relative to alignment holes 1020. In this way test head 110 and device handler 120 may be aligned to prevent damage to fragile contacts 14 during the docking procedure.

Device handler calibration fixture 1313 is used to properly position alignment pins 1005 relative to alignment holes 1020. In order to properly position alignment pins 1005, screws securing each alignment pin base 1007 to device handler 120 are loosened so that limited movement is possible between each alignment pin base 1007 and device handler 120. Device handler calibration fixture 1313 is then set on top of device handler 120. Device handler calibration fixture 1313 includes reference features 1320 (e.g. pins) which can be aligned to (or engage) reference features 1321 (e.g. openings) included in device handler 120. In this way, device handler calibration fixture 1313 is always identically positioned when it is set on top of the same device handler 120.

Device handler calibration fixture 1313 includes a plurality of calibration opening 1322. Each alignment pin base 1007 is moved so that each alignment pin 1005 precisely engages a respective calibration opening. Because of the tapered shape of each alignment pin 1005, if any alignment pin 1005 is not precisely positioned relative to the respective calibration opening 1322, load cell 1010 will indicate a load. Thus, the output of each load cell 1010 can be checked to ensure that each alignment pin 1005 is properly positioned. Once each alignment pin 1005 is properly positioned, the screws holding each alignment pin base 1007 are tightened, and device handler calibration fixture 1313 is removed.

Test head calibration fixture 1314 is used to properly position alignment holes 1020 relative to previously positioned alignment pins 1005. In order to properly position alignment holes 1020, test head 110 is rotated so that contacts 14 face upwards. The screws securing each protection plate 1012 to test head 110 are loosened so that limited movement is possible between each protection plate 1012 and test head 110. Test head calibration fixture 1314 is then set on top of test head 110. Test head calibration fixture 1314 includes reference features 1322 (e.g. openings) which can be aligned to (or be engaged by) reference features 1323 (e.g. pins) included in test head 110. In this way, test head calibration fixture 1314 is always identically positioned when it is set on top of test head 120.

Test head calibration fixture 1314 includes a plurality of calibration pins 1324 which correspond to the location of alignment pins 1005. Each protection plate 1012 is moved so that each alignment hole 1020 is precisely engaged by a respective calibration pin 1324. Once each protection plate 1012 is properly positioned, the screws holding each protection plate 1012 to test head 110 are tightened.

Once each protection plate 1012 is properly positioned, each LVDT is calibrated relative to the top surface of contacts 14. This calibration is desirable to provide the electronics (e.g. processor system 1090, described below) with signals generated by each LVDT 1015 which represent how far each LVDT's spring loaded pin is pressed inward into each LVDT when each LVDT's spring loaded pin is at the same height as contacts 14. As previously described, contacts 14 may be, for example, pogo pins (collapsible, spring-like pins) or static pins (e.g., as in a Hypertac connector arrangement). Each LVDT 1015 is physically moved upward or downward within protection plate 1012 and is then secured into place so that each LVDT's spring loaded pin makes contact with the test head calibration fixture 1314 and is pressed inward into each LVDT (e.g. by one tenth of an inch) so that each LVDT's pin is in operating range within the LVDT and each LVDT begins to register. Thus, each LVDT's spring loaded pin is aligned with the top of each of the pogo pins (in a non-compressed state). The signal generated by each LVDT (corresponding to the amount by which each LVDT's pin is pressed inwards) is then stored in the electronics (e.g. processor system 1090). This signal is defined as corresponding to the desirable inward compression of each LVDT's pin instantaneously prior to mating of contacts with 14 to connectors 15 during docking of test head 110 to device handler 120. The test head calibration fixture 1314 is removed.

Because calibration pins 1324 and calibration openings 1322 are formed in corresponding positions in calibration fixtures 1313, 1314, the calibration procedure set forth above results in alignment pins 1007 and alignment holes 1020 relatively coinciding to facilitate accurate docking of contacts 14 and connectors 15.

Once alignment pins 1007 and alignment holes 1020 are properly positioned, the various lock screws included in positioner system 200 are loosened so that positioner system 200 may move test head 110 with six degrees of motion (X, Y, Z, θX, θY, θZ) so that alignment holes 1020 on test head 110 are engaged by alignment pins 1005 on device handler 120. Motion in the Z direction is accomplished by actuating motor 212. Motion in the θY direction is accomplished by actuating motor 132. Motion in the θX direction is accomplished by loosening lock screw 503 (or loosening lock screws 628 and turning pitch adjust screws 615a,b). Motion in the X direction is accomplished by loosening lock screw 512 (or loosening lock screws coupled to horizontal rail 51). Motion in the Y direction is accomplished by loosening lock handle 4b. Motion in the θZ direction is accomplished by loosening lock handle 3 (or loosening the screws going through slots 651).

After installation has been completed, movement of the test head 110 in four degrees of motion (i.e. the non-motorized degrees of motion) will be restricted until a new installation (i.e., change in alignment between test head 110 and device handler 120) is required. In this manner, accurate docking between test head 110 and device handler 120 when test head 110 is in actual operating use is accomplished strictly under motor control as provided by stepper motors 132 and 212. In this manner, as explained below, fully automated docking of test head 110 to device handler 120 is obtained.

Misalignment during automated docking between test head 110 and device handler 120 will result in misalignment between alignment hole 1020 and respective alignment pin 1005. Misalignment between alignment hole 1020 and respective alignment pin 1005, as previously explained, will result in load detection from load cell 1010. Thus, the detection of load from load cell 1010 indicates misalignment between test head 110 and device handler 120 and docking can be aborted until the cause of the misalignment is repaired.

Figure 11:
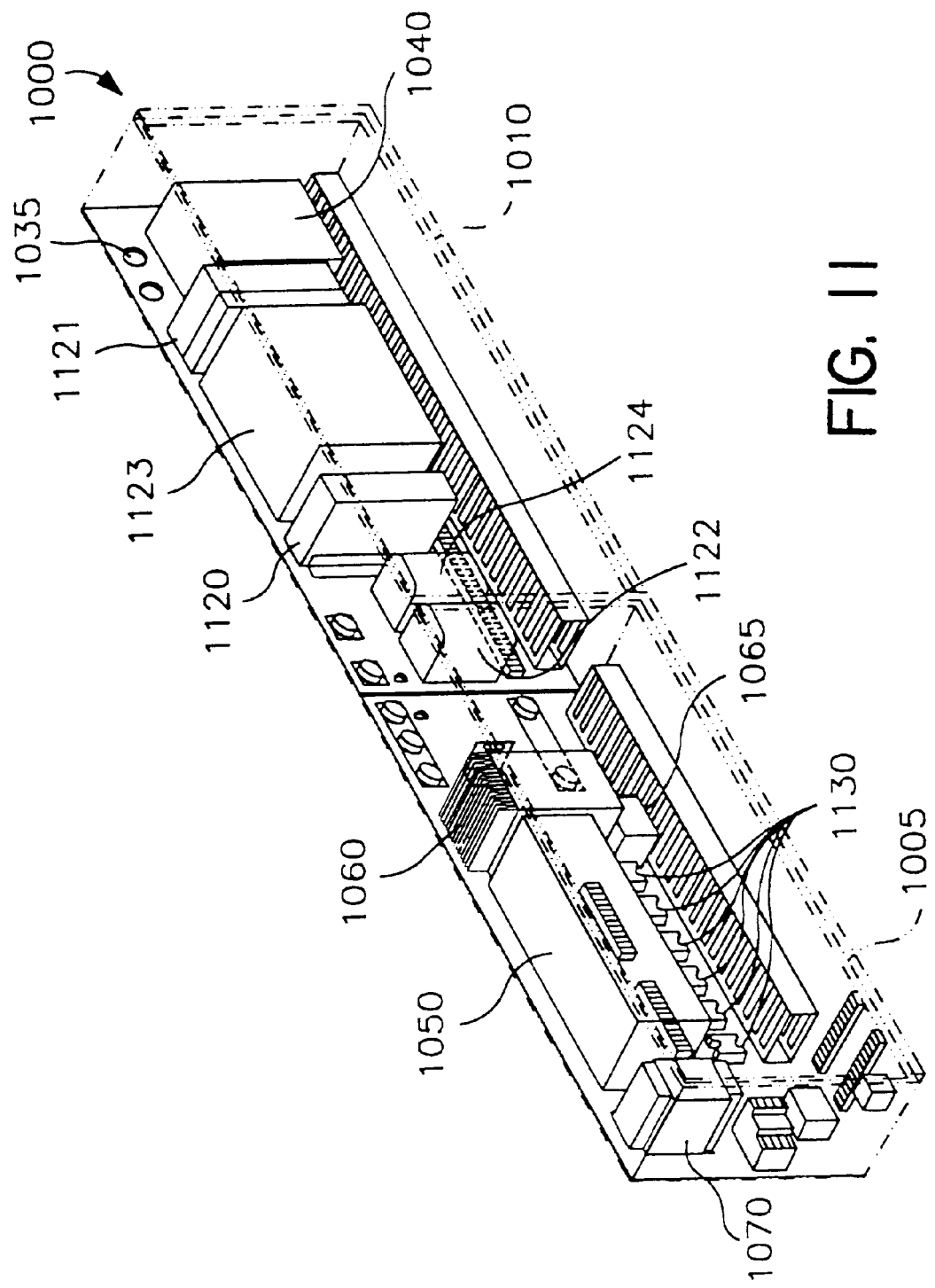
FIG. 11 is a perspective view of the enclosure which contains the electronic components for docking the test head with the device handler in accordance with an exemplary embodiment of the present invention.

FIG. 11 is a perspective drawing which shows the electronics cabinet 1000 with its various electrical components which enable the automated docking of test head 110 to device handler 120. Relays 1122, 1124 actuate the various motors. Step up auto transformer 1070 converts 115 volt AC to 230 volt AC (for use, again, by the motors—alternatively, if there is 230 volt AC service a step down transformer may be included to provide 115 volt AC). Power supply 1060 provides a 24 volt DC output. This 24 volt DC output is used for powering limit switches 80a,b (on horizontal member 8), limit switch 135 (on the roll axis), a switch (not shown) on device handler 120, a switch (not shown) on the test head, brakes 115, 131 and a relay contact in the light screen. Driver 1121 is used for driving stepper motor 132. Driver 1123 is used for driving stepper motor 212. Power supply 1065 is used for powering LVDT 1015, load cell 1010, inclinometer 512, and inclinometer 510. Processor system 1090 is also included.

Figure 12:
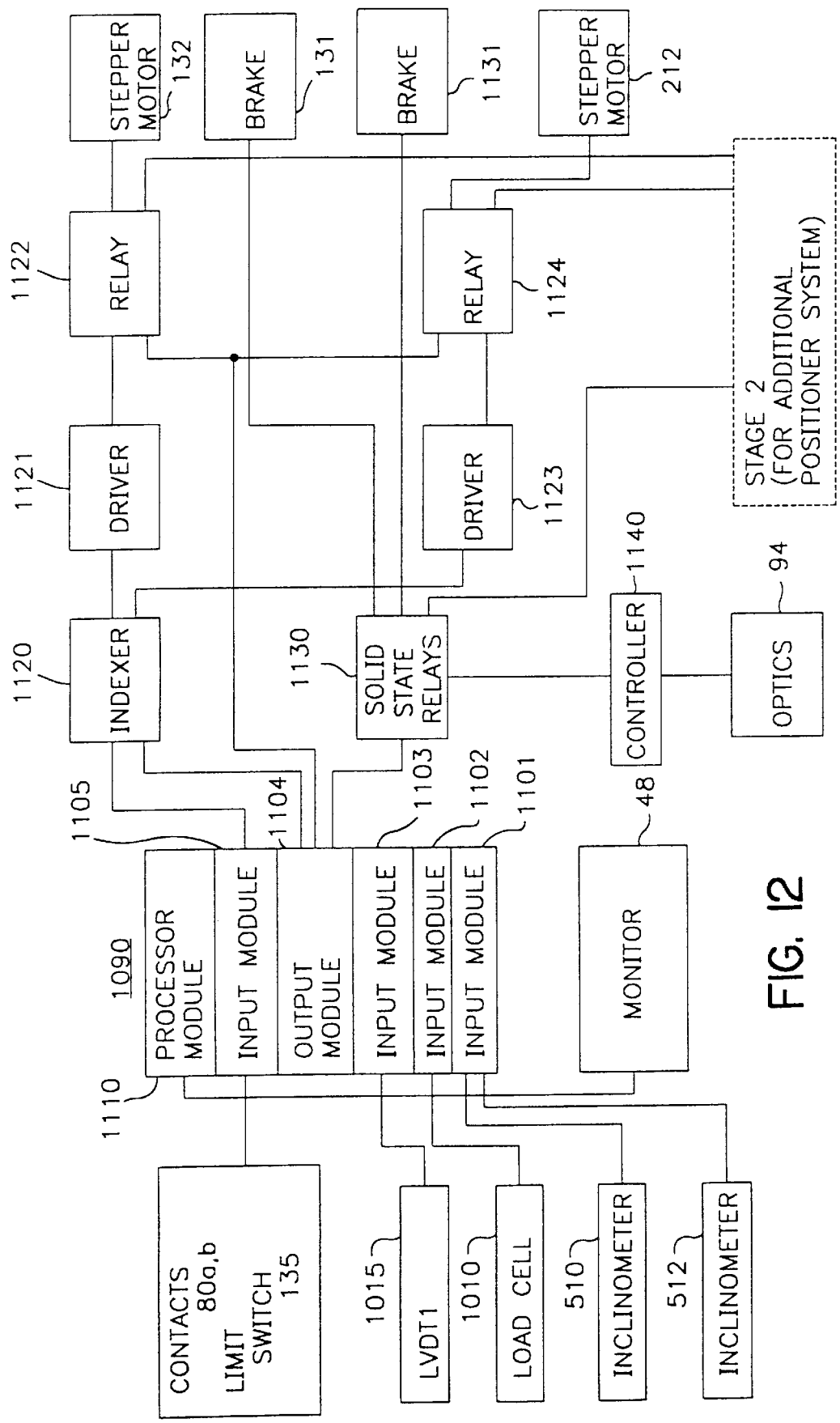
FIG. 12 is a block diagram which illustrates the operation of the electronic components included in an exemplary embodiment of the present invention.

The inter-relationship with the various electrical components shown in FIG. 11 is more clearly illustrated by FIG. 12. As shown in FIG. 12, processor system 1090 includes processor module 1110 (e.g., model SLC5/03 manufactured by Allen Bradley Corporation), input module 1101, input module 1102, input module 1103, output module 1104, and input module 1105 (e.g. all also manufactured by Allen Bradley Corporation). Input module 1101 receives input signals from inclinometers 510 and 512. Input module 1102 receives input signals from load cell 1010. Input module 1103 receives input signals from LVDT 1015. Monitor 48 (also shown in FIG. 2) is also included. Processor module 1110 receives input data from, and transmits display data to, monitor 48. Input module 1105 receives input data from contacts 80a, b and limit switch 135. Output module 1104 transmits signals to indexer 1120. Indexer 1120 communicates with driver 1121 which results in actuation of stepper motor 132. indexer 1120 also transmits signals to driver 1123 which results in actuation of stepper motor 212. Output module 110 transmits signals to solid stat e relays 1130 to release and apply brakes 131 and 115. The optical circuits of light circuit 94 may transmit a light interruption signal to controller 1140. Controller 1140 can then transmit a signal to solid state relays 1130 resulting in brake 131 and brake 115 being applied. Output module 1104 also transmits signals to relays 1122 and 1124 to switch the output signals of drivers 1121 and 1124 between the present positioner system (stage 1) and an additional positioner system (stage 2).

Indexer 1120 is also capable of transmitting a signal indicative of the rotation of stepper motor 132 and stepper motor 212. A signal generated by indexer 1120 indicative of the rotation of the stepper motors can be transmitted into input module 1105 for use by processor system 1090.

Thus, a variety of mechanisms are used in order to determine the actual location of test head 110. Vertical position is detected in one of several ways. When the test head 110 is initially being lowered towards device handler 120, the (coarse) vertical position of test head 110 is initially determined as a result of signals generated by inclinometer 510. Specifically, processor system 1090 is programmed with the relationship between the vertical position of test head 110 and the angular position of linkage structure 20b. Thus, when processor system 1090 receives signals from inclinometer 510, processor system 1090 converts these signals into the vertical position of test head 110. As test head 110 approaches device handler 120, the position of test head 110 is determined using LVDTs 1015. As each LVDT 1015 makes contact with the respective alignment pin base 1007 and test head 110 continues to move towards device handler 120 the pin extending from each LVDT 1015 is pushed inwards. Each LVDT then transmits a signal to processor system 1090 indicative of the distance by which each LVDT's spring loaded pin is pressed inwards. The more each LVDT's spring loaded pin is pressed inwards (i.e., the greater the compression—distance of each LVDT) the closer test head 110 is to device handler 120.

The LVDTs (identified again as LVDT1, LVDT2, LVDT3, and LVDT4) can be used to measure roll, pitch and compression of the test head.

Roll measures the difference in distance between the right side 110a of the test head 110, and device handler 120 and the distance between the left side of 110b of test head 110 and device handler 120. Roll is positive when right side 110a is lower then left side 110b. In an exemplary embodiment of the present invention, the measurement is in milli-inches. Roll is calculated in accordance with equation 1.

$$\text{roll} = [(\text{LVDT3} + \text{LVDT4}) - (\text{LVDT1} + \text{LVDT2})]/2 \qquad (1)$$

Pitch measures the difference in distance between the rear side 110d of test head 110 and device handler 120 and the distance between the front side 110c of test head 110 and device handler 120. Pitch is positive when the rear side hod is higher then the front side 110c. In an exemplary embodiment of the present invention, the measurement is in milli-inches. Pitch is calculated in accordance with equation 2.

$$\text{pitch} = [(\text{LVDT2} + \text{LVDT3}) - (\text{LVDT1} + \text{LVDT2})]/2 \qquad (2)$$

Compression measures the average distance between each side 110a–d of test head 110 and device handler 120 (i.e., the average compression—distance of the LVDTs). In an exemplary embodiment of the present invention, this measurement is made in milli-inches. Compression is calculated according to equation 3.

$$\text{compression} = (\text{LVDT1} + \text{LVDT2} + \text{LVDT3} + \text{LVDT4})/4 \qquad (3)$$

Using the LVDTs and the inclinometers, it is possible to "teach" the test head to be in one of several positions with regard to the device handler. These positions could be defined as follows:

docked: the docking surface of the test head is facing and in contact with the docking surface of the device handler;

undocked: the docking surface of the test head is facing the docking surface of the device handler, but separated from it;

manual: the test head is separated from the device handler. The docking surface of the test head is perpendicular to the docking surface of the device handler; and maintenance: the test head is separated from the device handler. The docking surface of the test head is rotated 180° away from the docking surface of the device handler.

In order to perform automatic docking of test head 110 with respect to device handler 120, processor module 1010 is "taught" the docked position of test head 110 after the initial mechanical installation and alignment of test head 110 and device handler 120 (previously described) has been accomplished. Processor 1010 is "taught" the docked position of test head 110 after calibration of alignment pins 1005 and alignment holes 1020 as previously described and relative to device handler 120 as follows.

Figure 13C:
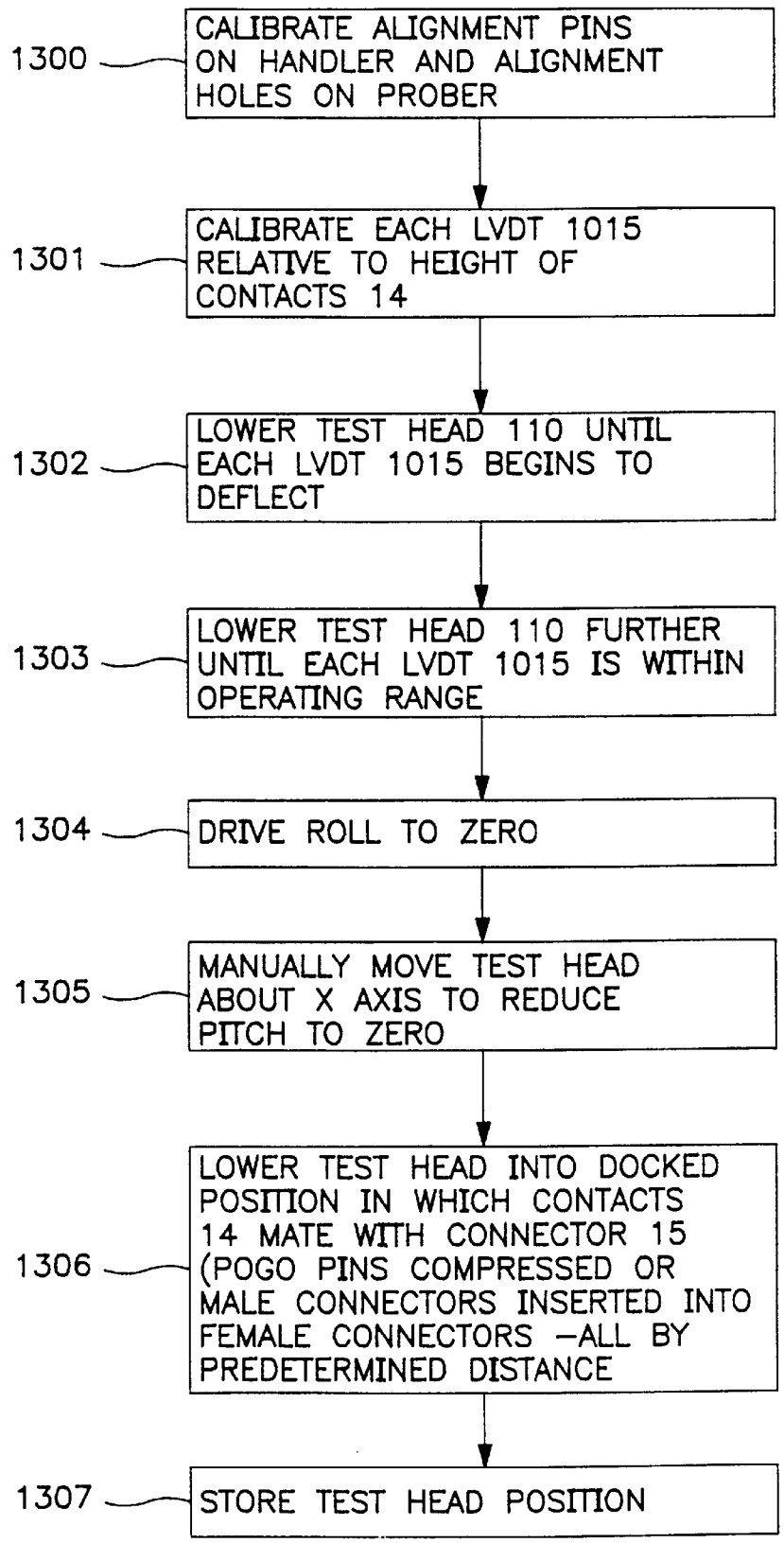
FIG. 13c is a flow chart diagram which illustrates programming of the processor system for performing automatic docking.

As shown in FIG. 13c at step 1300, the positioning of alignment pins 1005 and alignment holes 1020 as previously described is accomplished. At step 1301, each LVDT is calibrated relative to the height of contacts 14 as previously described with reference to FIG. 13a. At step 1302, stepper motors 132, 212 are manually actuated in order to bring test head 110 approximately parallel to device handler 120. To actuate these motors, operator terminal 48 is programmed with push buttons MOVE UP, MOVE DOWN, ROLL COUNTERCLOCKWISE (CCW) and ROLL CLOCKWISE (CW) for actuating the respective motor in the appropriate direction. The test head is then lowered until each of the LVDTs begin to make contact with the device handler and each LVDT begins to compress. As test head 110 is lowered, the speed of stepper motor 212 is decreased. Next, at step 1303, the MOVE DOWN push button is depressed to lower the test head until all of the LVDTs are within operating range (e.g., plus or minus 0.2500 inches). At step 1304, the ROLL CCW and ROLL CW push buttons are depressed until a roll value of 0 is established. ROLL CCW makes the roll more negative. ROLL CW makes the roll more positive. At step 1305, test head 110 is raised manually moved along the X axis to reduce the pitch to 0. This is accomplished by loosening locks group 503. The roll is then checked and readjusted if necessary. At step 1306, the MOVE DOWN push button is depressed to lower test head 110 so that the pogo pins comprising contacts 14 are compressed (as determined by the signals generated by the LVDTs) by a desired distance (or the male connectors on test head 110 are inserted into the female connectors on device handler 120 by a desired distance). Roll and pitch are then readjusted as necessary. At step 1307, when the desired docking position has been achieved, a TEACH DOCKED push button on operator terminal 48 is depressed. This stores the roll, pitch and compression settings of the LVDTs in a memory of processor module 1110.

With regard to step 1306 (described above) there are various teachings in the art as to how close test head 110 and device handler 120 should be. This distance is carefully measured because this distance relates to the total distance by which pogo pins (if contacts 14 are pogo pins) are compressed or the total distance (if contacts 14 are male/female connectors) by which the male connectors are inserted into the female connectors counterparts). The distance by which the pogo pins should be compressed (or the male connectors inserted into the female connectors) will vary widely depending upon the manufactures and specifications of the pogo pins (or male/female connectors). However, the pogo pins will typically be compressed 80% of total available stroke (or the male connector will be inserted 80% of the female connector's depth). Thus, by measuring the distance between test head 110 and device handler 120 by using each LVDT 1015, test head 110 can be lowered for the desired distance of compression of the pogo pins (or insertion depth using male/female connectors).

Figure 14:
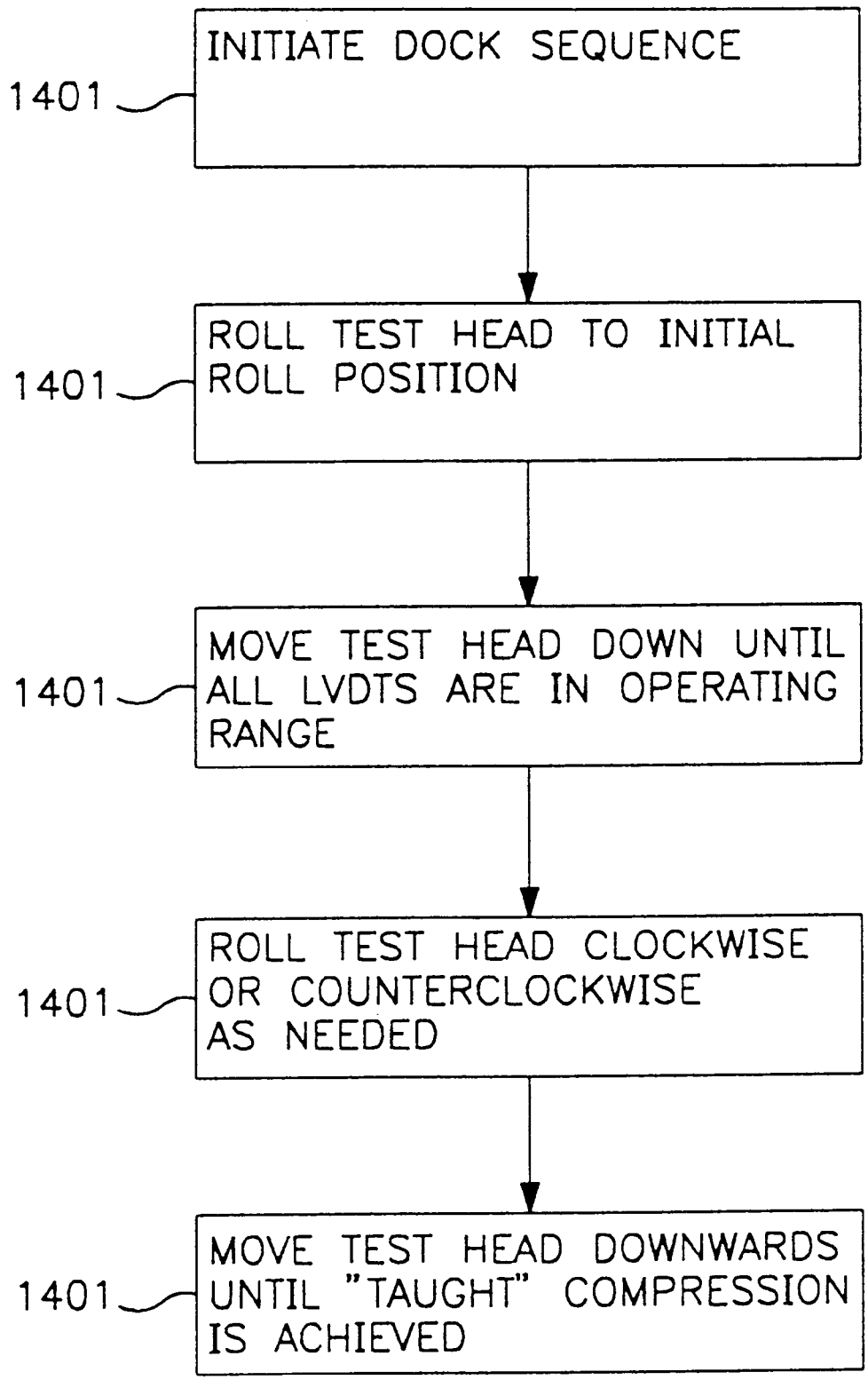
FIG. 14 is a flow chart diagram which illustrates manipulation of the test head during automatic docking.

Once the docked position of test head 110 relative to device handler 120 has been "taught" to processor module 1110, test head 110 can automatically be docked to device handler 120. This is accomplished as follows with reference to FIG. 14. At step 1401, a DOCK push button on operator terminal 48 is depressed. If based on the reading of inclinometer 510 the test head is below a predetermined level, the test head is raised. This avoids test head 110 making contact with device handler 120 accidently while test head 110 is being rotated. At step 1402, processor system 1090 transmits appropriate signals to indexer 1120 for stepper motor 132 to roll test head 110 to an initial roll position. At step 1403, processor system 1090 transmits signals to indexer 1120 for stepper motor 212 to move test head 110 down until all LVDTs have made contact and are within operating range. At step 1404, processor system 1090 test head 110 clockwise or counter clockwise as required until the roll condition matches the "taught" roll position within plus or minus a preprogrammed amount (e.g. 0.002"). At step 1405, processor system 1090 provides appropriate signals for stepper motor 212 to move test head 110 down until the compression matches the taught compression within plus or minus a preprogrammed amount (e.g. 0.002"). Steps 1403–1405 may be iterated until both roll and compression are within plus or minus a preprogrammed amount (e.g. 0.002") of their "taught" values.

Misalignment during automated docking between test head 110 and device handler 120 will result in misalignment between alignment hole 1020 and respective alignment pin 1005. Misalignment between alignment hole 1020 and respective alignment pin 1005, as previously explained, will result in load detection from load cell 1010. Thus, the detection of load from load cell 1010 indicates misalignment between test head 110 and device handler 120 and docking can be aborted until the cause of the misalignment is repaired.

As previously described, the test head may be in the manual or maintenance positions. An "undocked" position, with test head 110 moved away from device handler 120 also exists. Each of these positions may be "taught" to processor from terminal 48. Specifically, the test head is raised to the desired height and rolled to the desired orientation using MOVE UP, MOVE DOWN, ROLL CCW and ROLL CW push buttons. TEACH UNDOCKED, TEACH MANUAL, and TEACH MAINTENANCE push buttons may then be depressed to store the respective positions of test head 110 within processor system 1090. Once processor system 1090 has been "taught" the undock, manual and maintenance positions, these positions may be automatically achieved by pressing the respective push buttons on monitor 48. In each case, when the appropriate push button is pressed, the test head is usually raised to its top most position, rolled to the "taught" orientation, and then lowered to the "taught" height. It is desirable to raise the test head to its top height (or near its top height) before rolling the test head to assure adequate clearance between the test head and the device handler.

Figure 15:
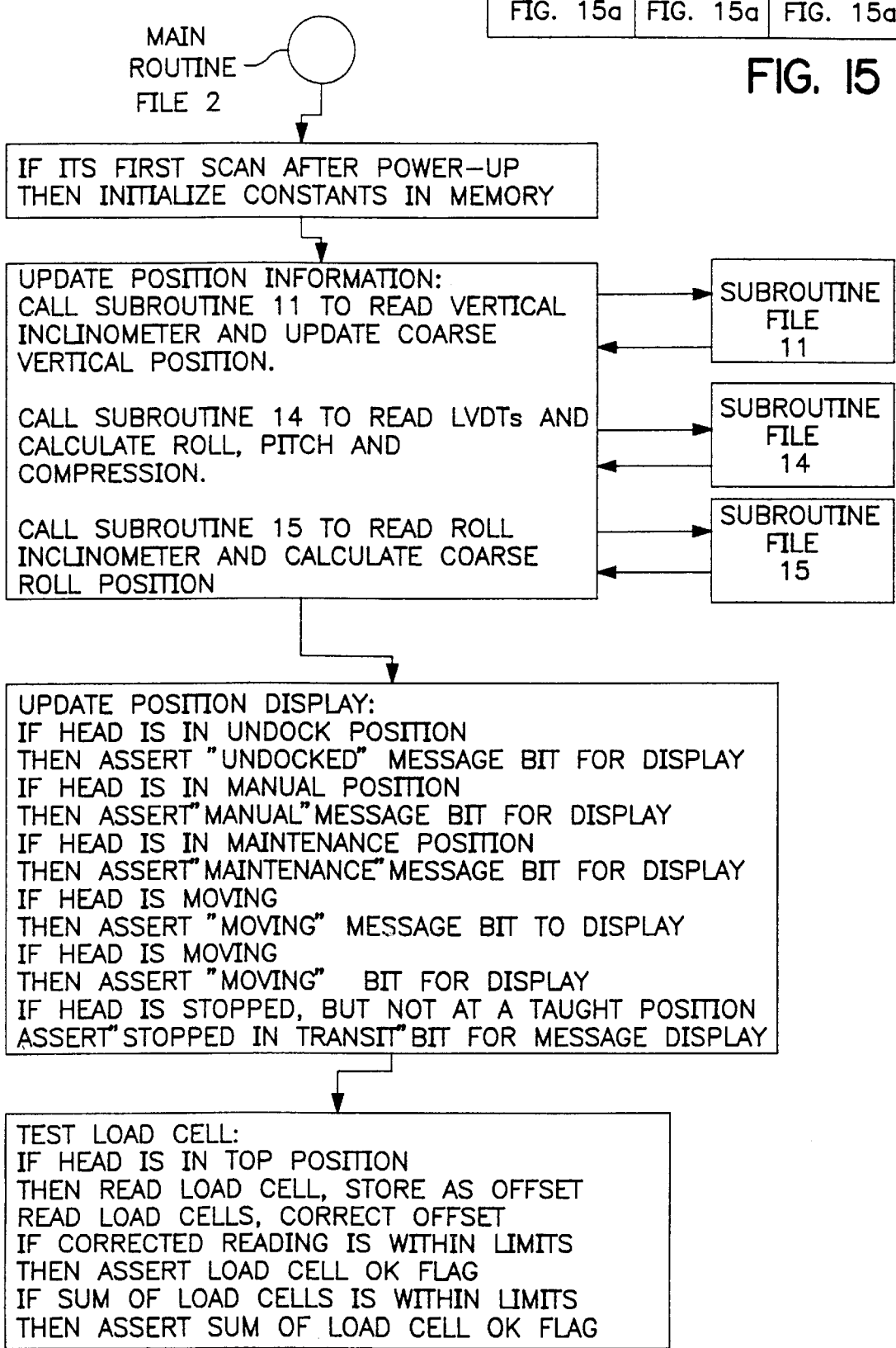
Figure 15B:
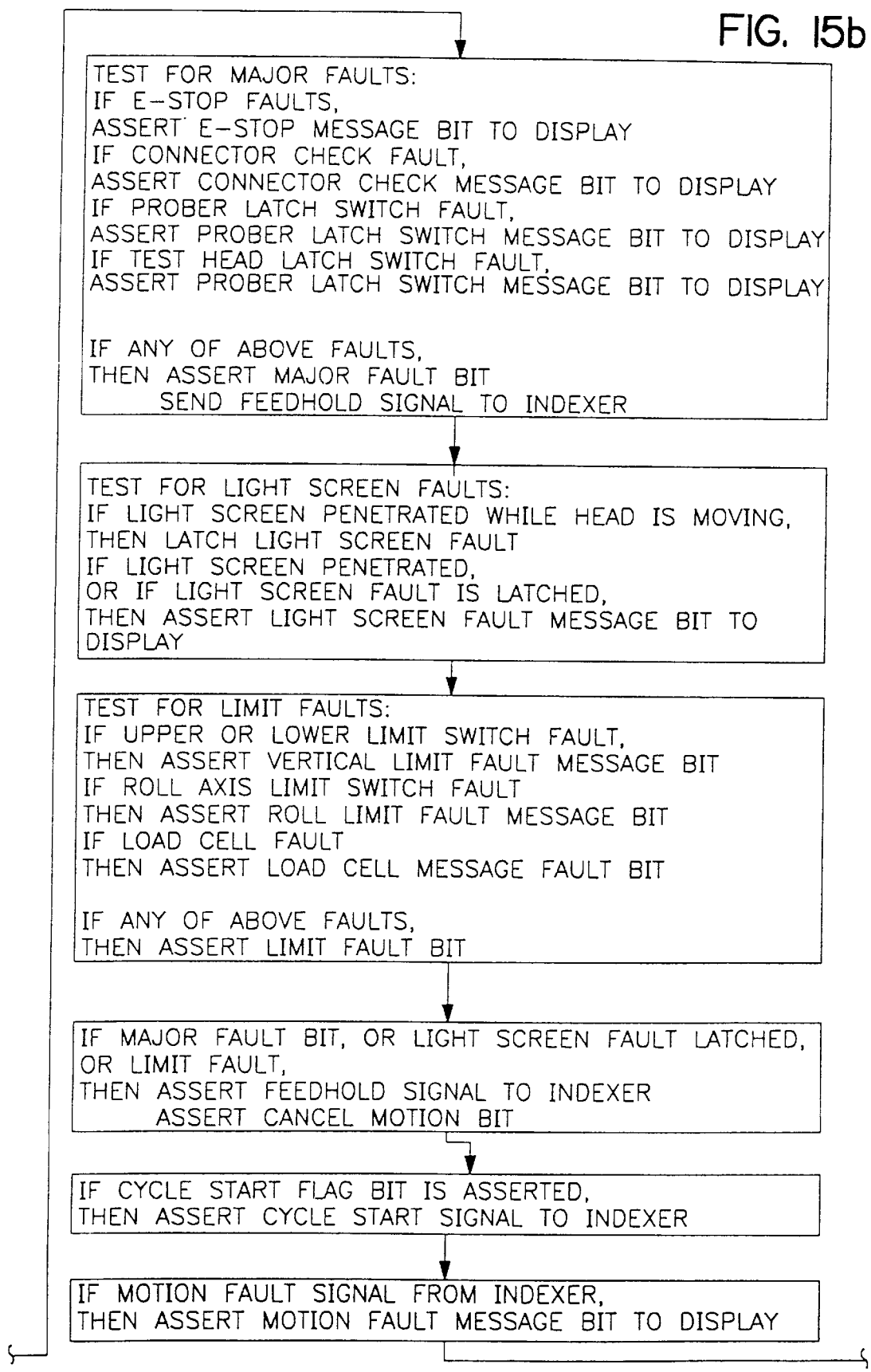
Figure 15C:
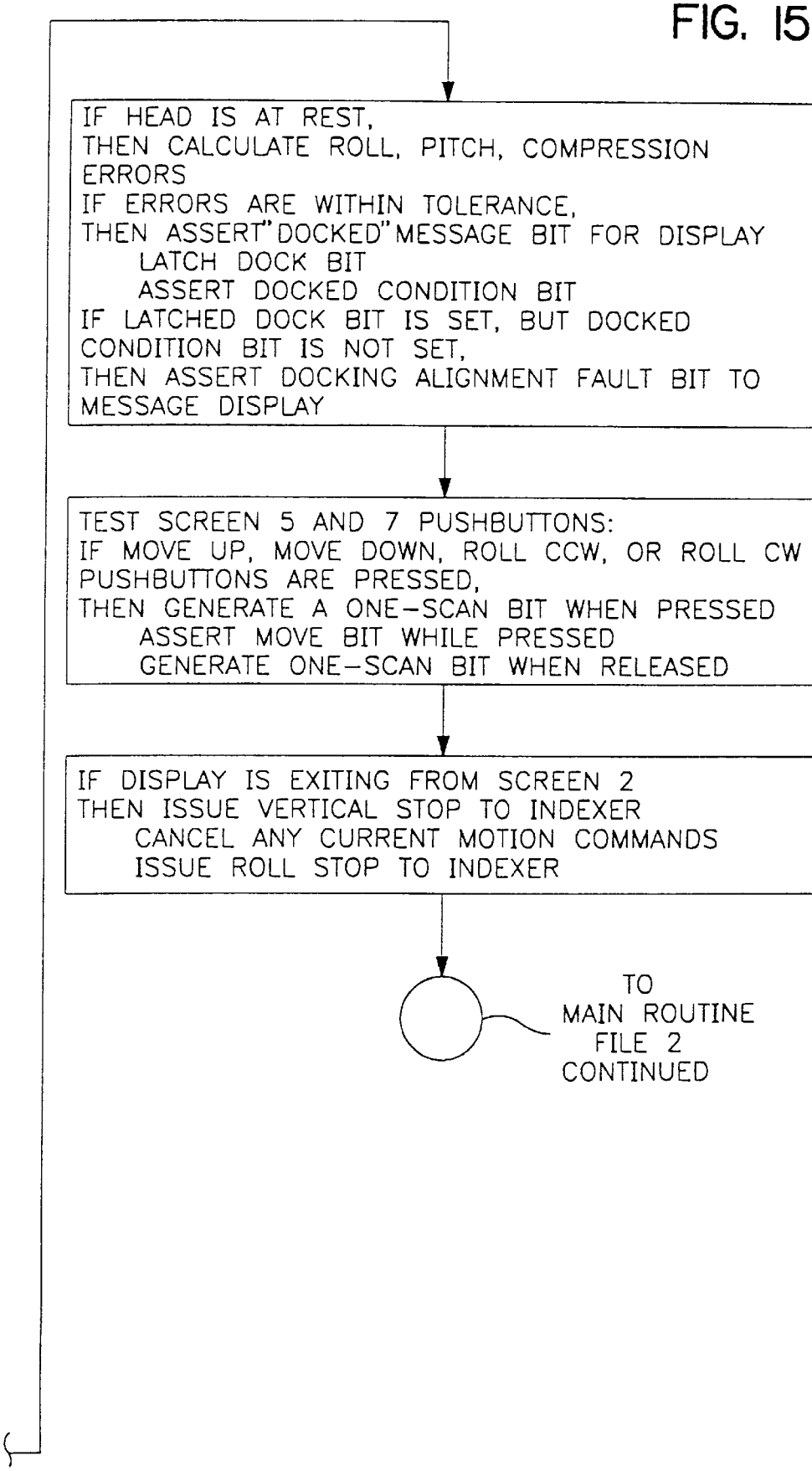
Figure 16A:
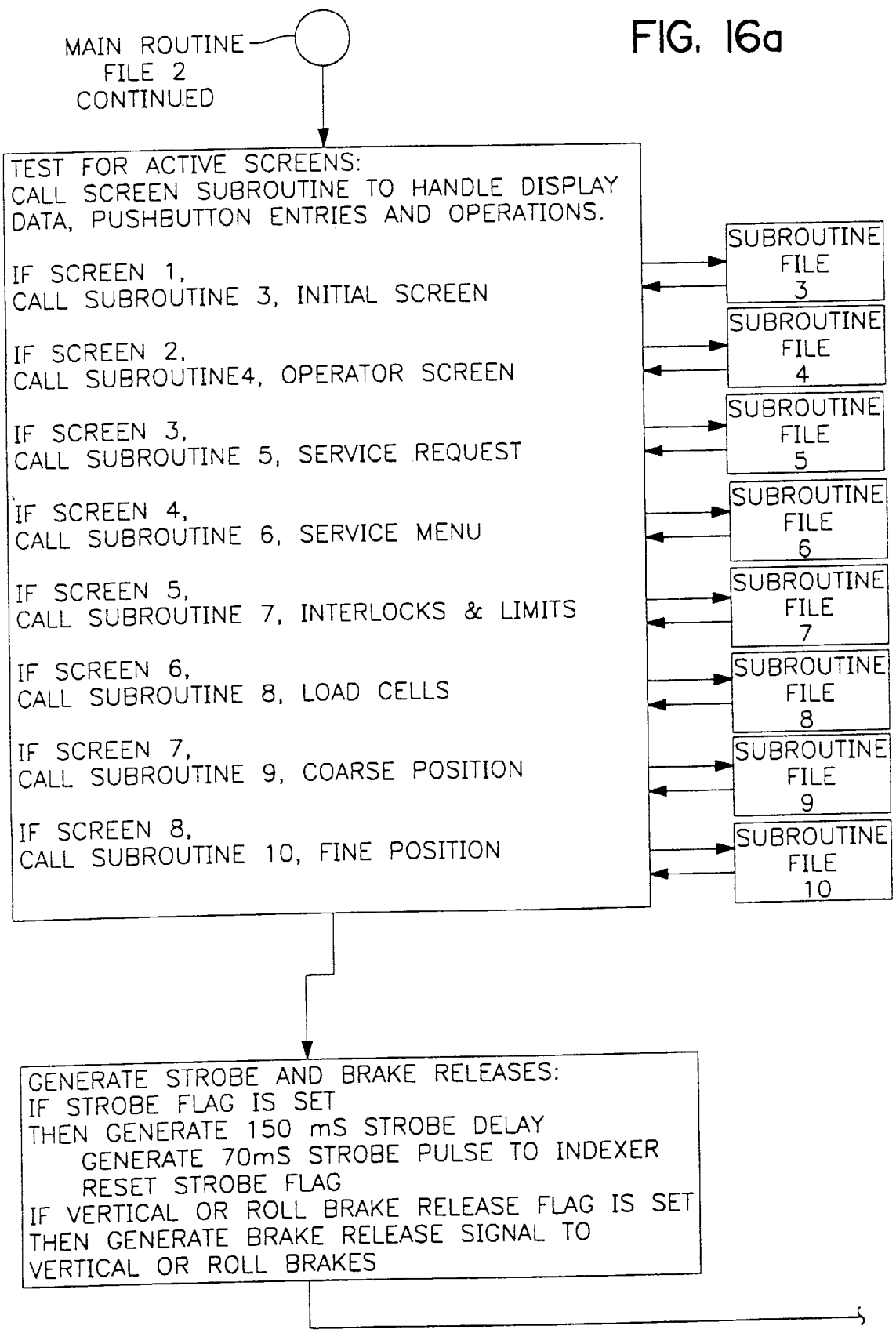
Figure 16B:
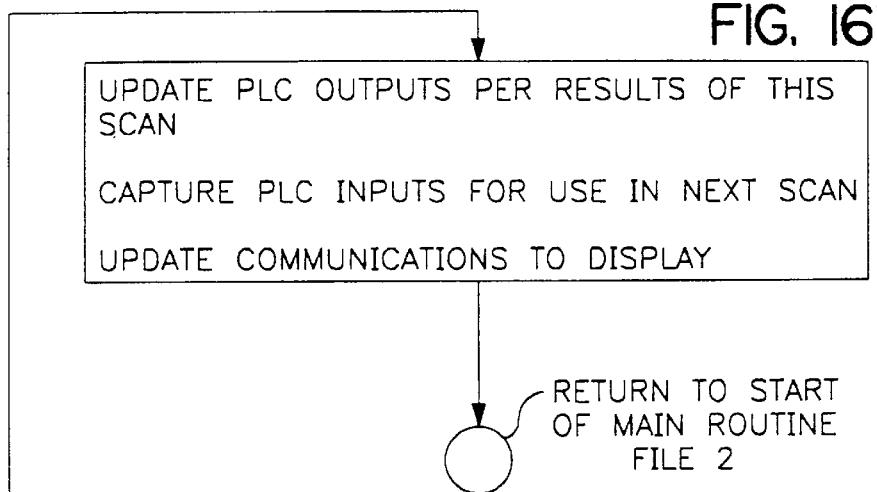
Figure 17A:
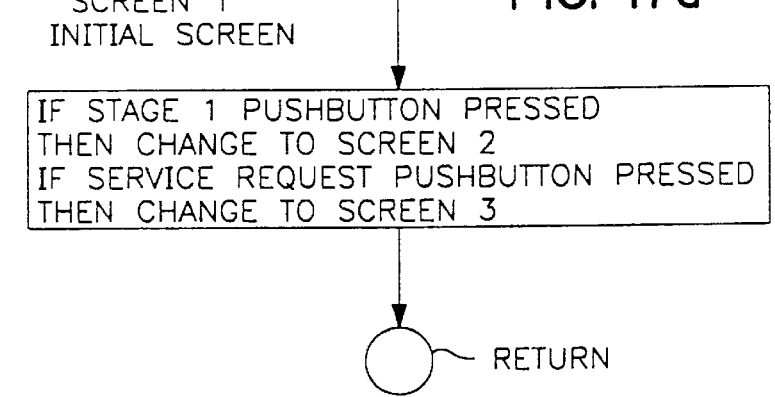
Figure 17B:
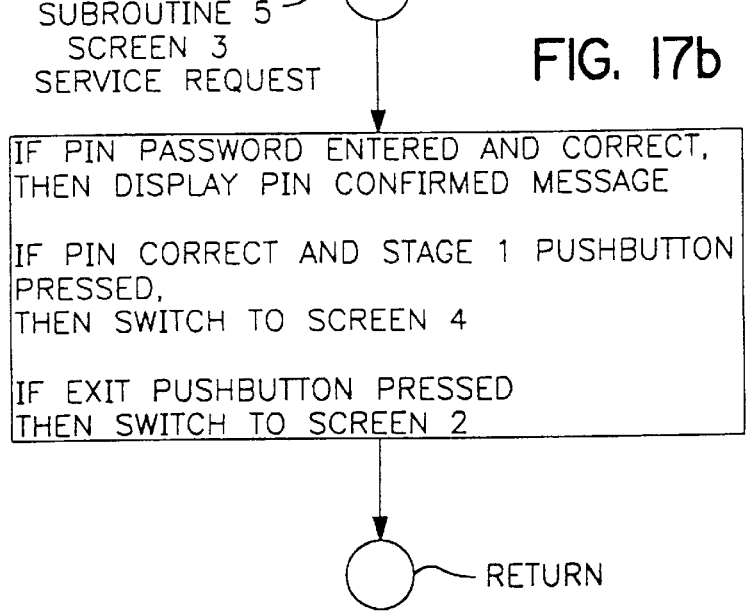
Figure 18B:
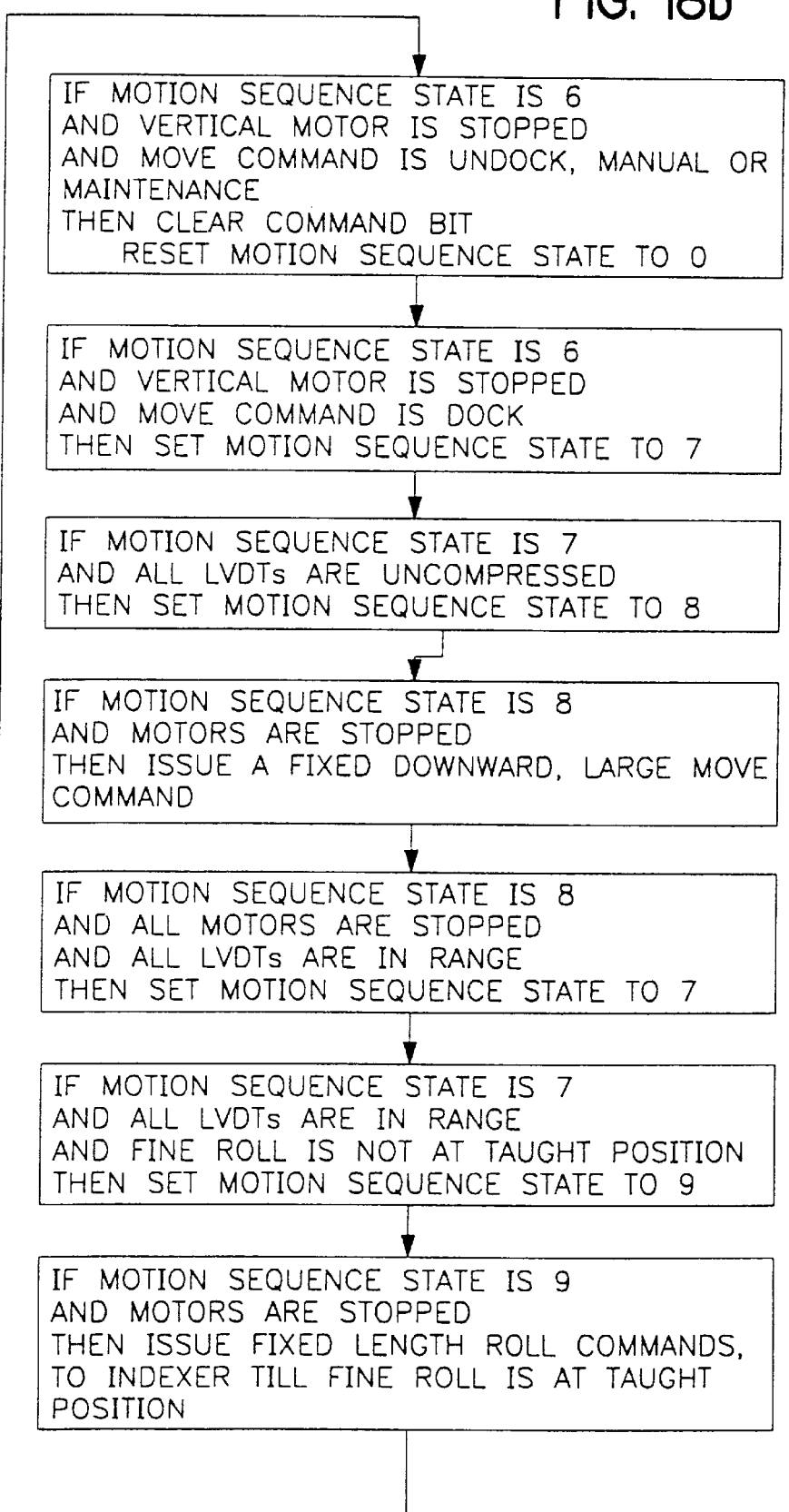
Figure 18C:
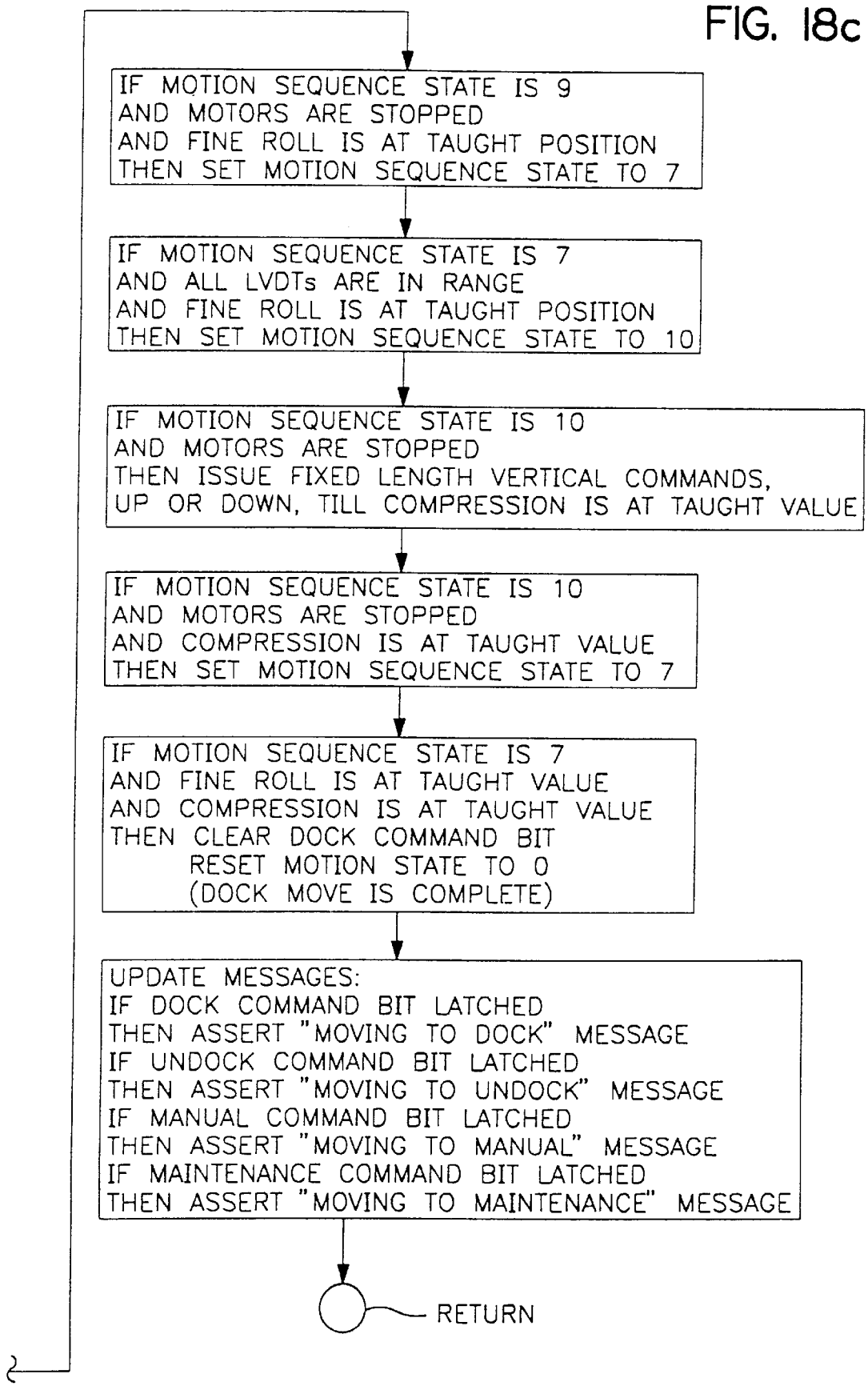
Figure 22:
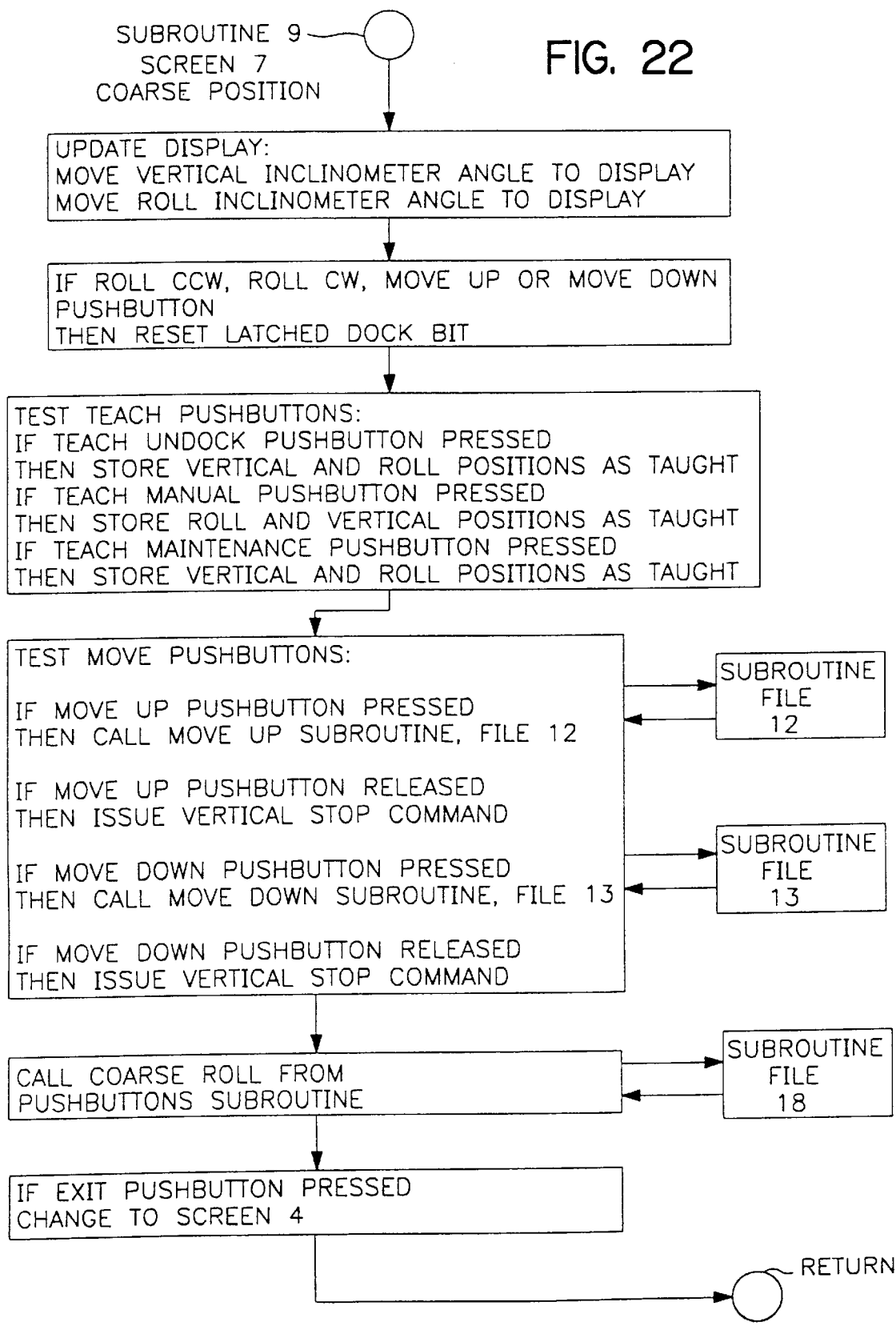
Figure 23:
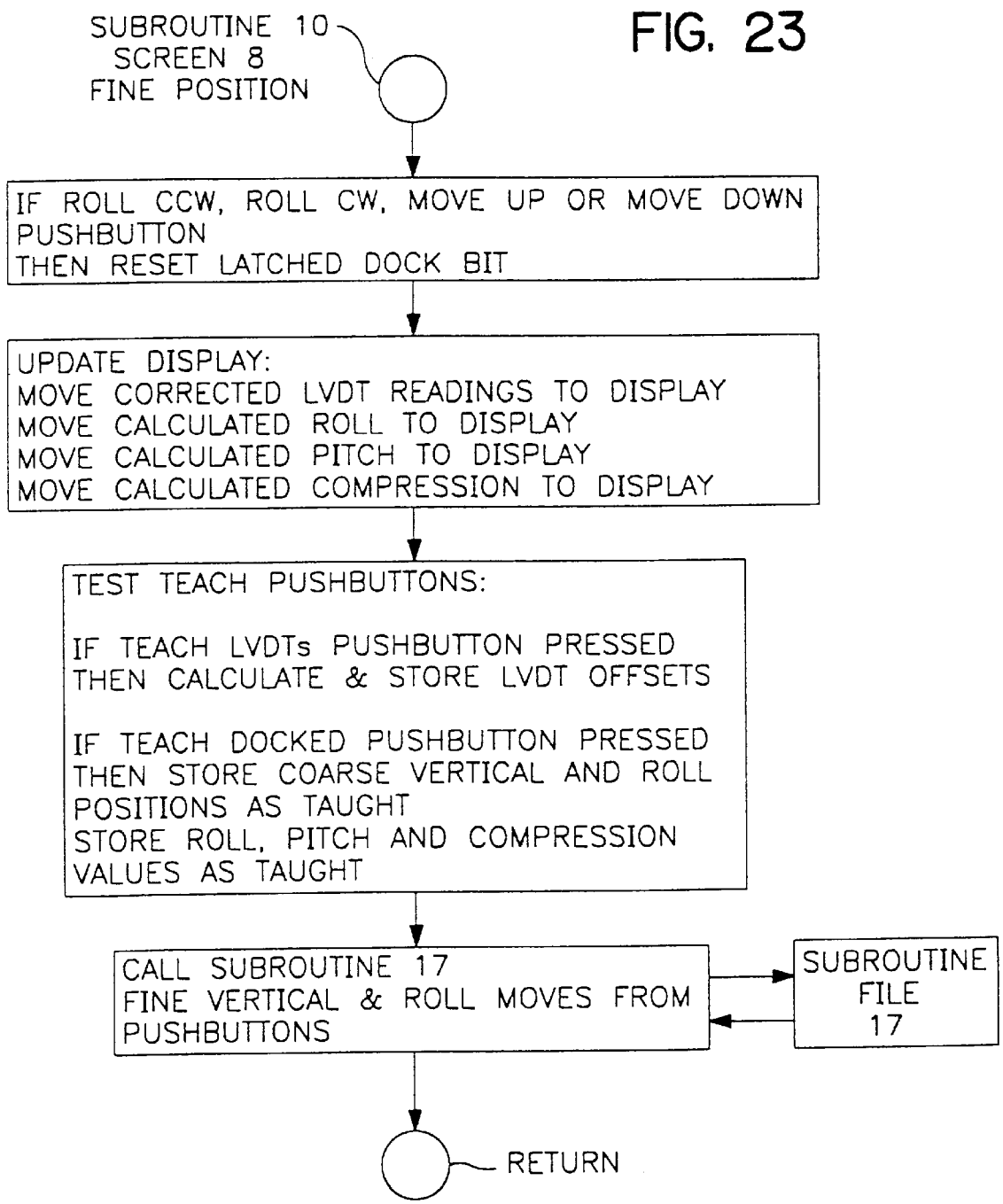
Figure 24:
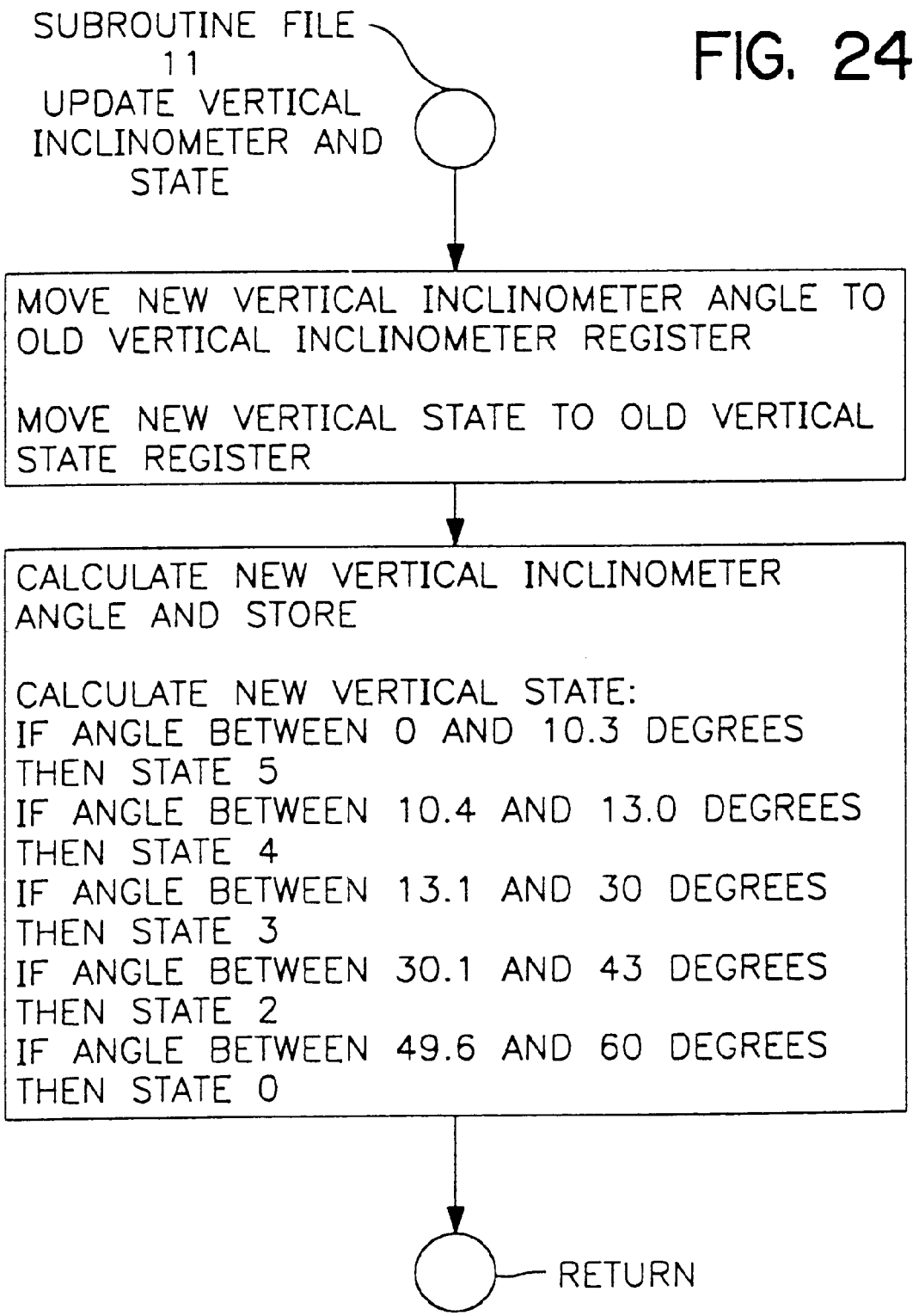
Figure 25:
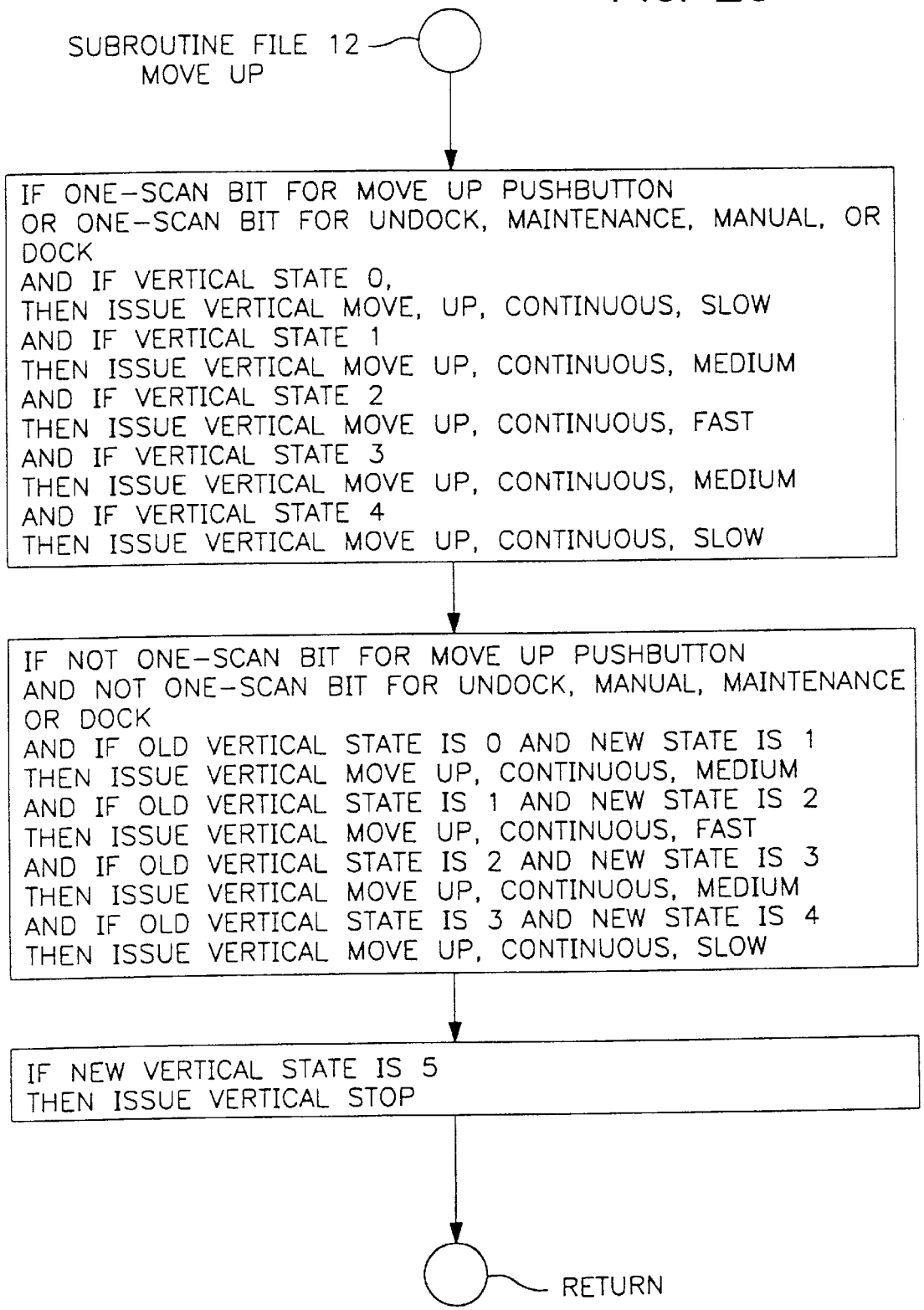
Figure 27A:
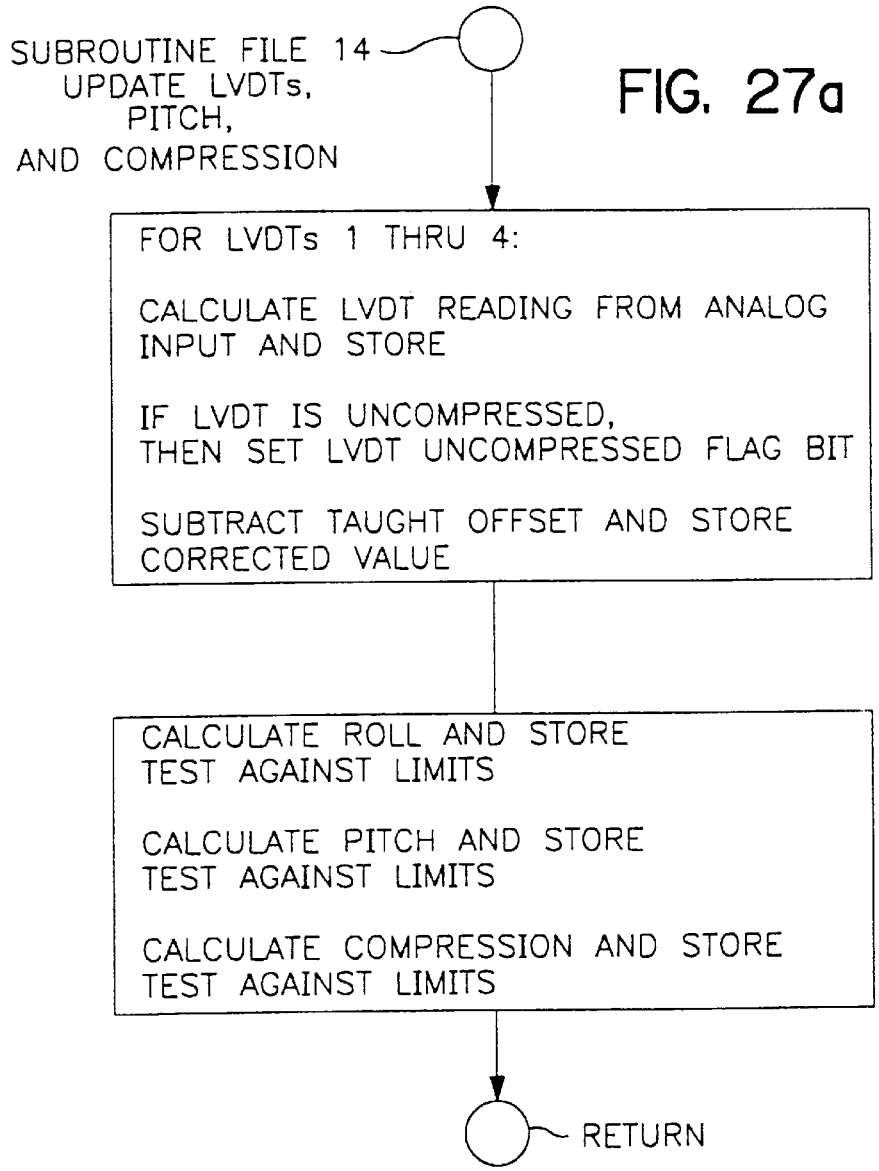
Figure 27B:
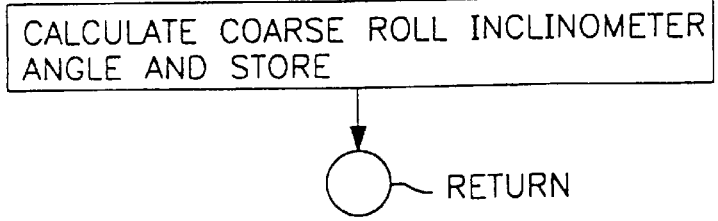

FIGS. 15–30 are flow chart diagrams which illustrate with some level of detail, the operation of processor module 1110 within processor system 1090. FIG. 15 illustrates routines for updating position information, updating the position display on monitor 48, testing load cells 1010, testing for major faults, testing for light screen faults, and testing for limit faults. FIG. 16 relates to screen management within monitor 48. FIGS. 17*a* and 17*b* also relate to screen management for monitor 48. FIG. 18 relates to control of stepper motors 212 and 132 while the test head is being moved. FIG. 19 relates to screen management on monitor 48. FIG. 20 relates to the display of monitor 48 and translating the depression of certain push buttons on monitor 48 into physical motion of the test head. FIG. 21 relates to display update and push button management for monitor 48. FIG. 22 relates to detection of push button depression in monitor 48 and storing "taught" positions. FIG. 23 also relates to detection of push button depression in monitor 48. FIG. 24 relates to data received from inclinometer 512. FIGS. 25 and 26 relate to moving the test head up and down respectively. FIG. 27*a, b* relates to storing values relating to updating LVDT 1010, pitch, compression and inclinometer 510. FIGS. 28–30 relate to actuation of motor 132.

As previously described, numerous safety mechanisms are included in order to avoid injury to the operator and damage to the equipment. For example, brakes 115, 131 are locked when AC power is removed from the system. Brakes 115 are locked before the start of vertical motion along the Z axis, and immediately after completion of vertical motion along the Z axis. Brakes 131 are locked before the start of motion about the Y axis, and immediately after completion of motion about the Y axis.

As previously stated, a light screen is included. If the light screen is penetrated, brakes 115, 131 lock immediately.

As previously stated, limit switches 80*a,b* are also included. These limit switches detect the ends of permissible travel of trolley 17*c*. The output of limit switches 80*a,b* sensed by processor system 1090 via input module 1105. If a limit condition is detected, any automatic motion in progress is halted, a fault message is displayed, and further motion into the limit is inhibited. There are also software limits narrower than the switch limits. An external emergency stop switch may also be included. Actuation of the external emergency stop switch locks all brakes and opens the AC line, removing AC power from the apparatus.

The invention has been described with each alignment pin base 1007 (each with alignment pin 1005) mounted on device handler 120 and each protection plate 1012 (each with alignment hole 1020) mounted on test head 110. However, as would be apparent to one of ordinary skill in the art, this order can be reversed so that each alignment pin base 1007 (with alignment pin 1005) is mounted on test head 110 and each protection plate 1012 (with alignment hole 1020) is mounted on device handler 120. A load cell 1010 would thus be under each alignment pin 1005 and coupled to test head 110. Each LVDT 1015 would remain coupled to test head 110. Each LVDTs pin is depressed inward into each LVDT after making contact with protection plate 1012. This embodiment is illustrated, for example, by FIG. 31*a*. Alternatively, as shown in the embodiment illustrated by FIG. 31*b*, each LVDT 1015 may be mounted into each protection plate 1012 on device handler 120. Each LVDTs pin is depressed inward into each LVDT after making contact with alignment pin base 1007.

Figure 31C:
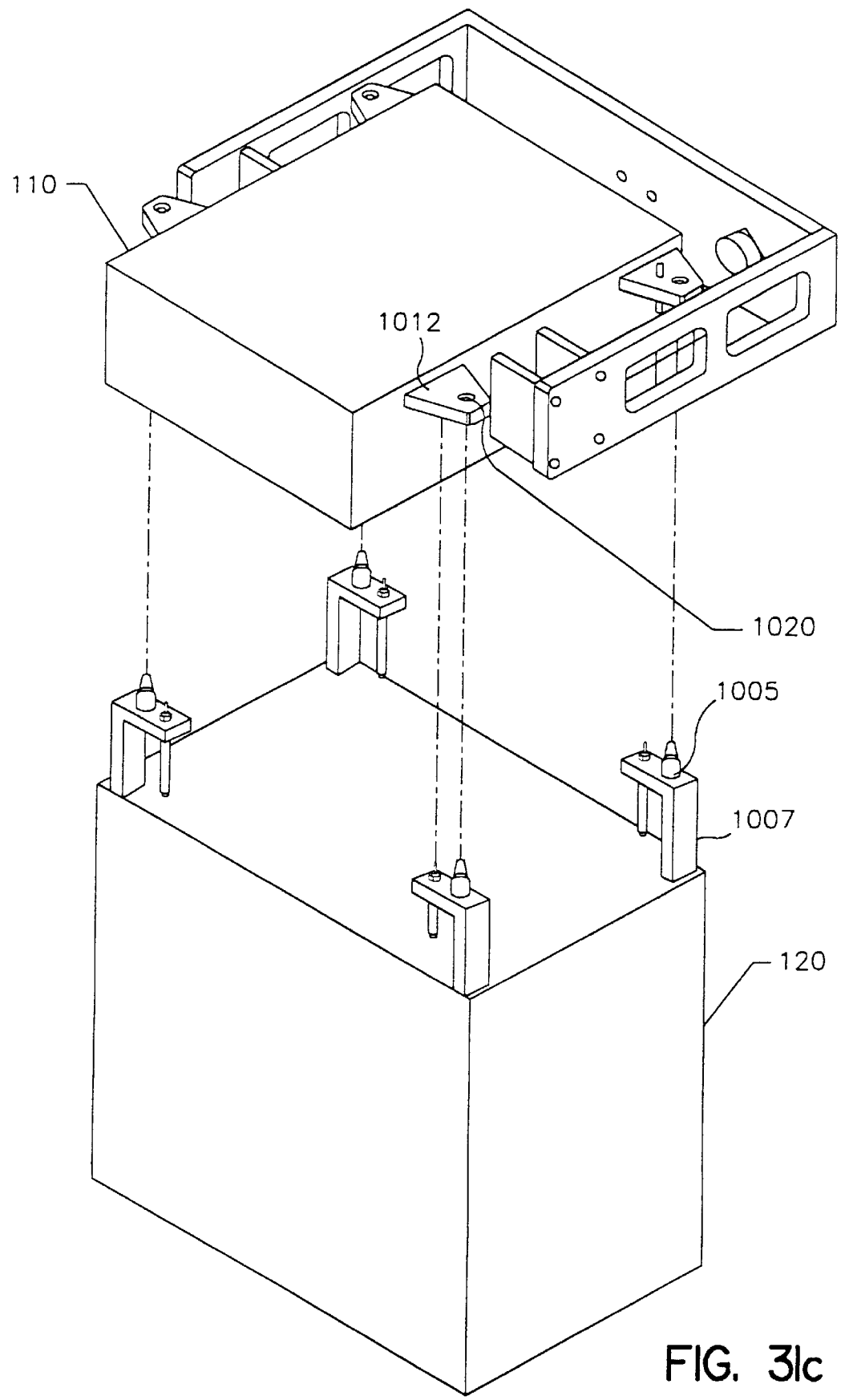

In a further alternative embodiment, illustrated, for example, by FIG. 31*c*, each alignment hole 1020 is formed in a protection plate 1012 which is attached to test head 110 and each alignment pin base 1007 with alignment pin 1005 is attached to device handler 120. Each LVDT 1015 is attached to device handler 120 instead of being attached to test head 110. Each LVDTs pin is depressed inward into each LVDT after making contact with protection plate 1012.

The invention has been described with a load cell 1010 under each alignment pin 1005. However, one of ordinary skill in the art would recognize that load cell 1010 could be used in conjunction with alignment hole 1020 instead. For example, alignment hole 1020 could be the opening of a floating bushing installed within protection plate 1012. Load cell 1010 could be appropriately positioned relative to the floating busing so that movement of the floating bushing relative to protection plate 1012 results in a load on load cell 1010. Thus, for example, if alignment pin 1005 does not accurately engage alignment hole 1020 (i.e. pin 1005 engages hole 1020 at an angle or not at all), load cell 1010 would signal a load (indicative of inaccurate docking). In this manner, accurate docking between contacts 14 and connectors 15 is again ensured.

The invention has been described with the use of LVDTs to determine the position of test head 110 relative to device handler 120. However, other types of proximity sensors (non-linear but repeatable sensors) may be substituted for the LVDTs. For example, optical type sensors may be used to determine the position of test head 110 relative to device handler 120. Furthermore, in place of inclinometers, angular position encoders (e.g. Allen Bradley Bulletin 845C) can be attached to any of the parts (e.g., gears, lead screws) rotated by motors 132, 212. The amount of rotation sensed by the angular position encoders can be translated into the distance of travel of test head 110 in order to determine the location of test head 110. Furthermore, the inclinometer used to measure vertical position via the angle of linkage arm structure 20b could be replaced with a variety of linear position encoders. All the substitution set forth above could be readily accomplished by one of ordinary skill in the art.

Figure 32:
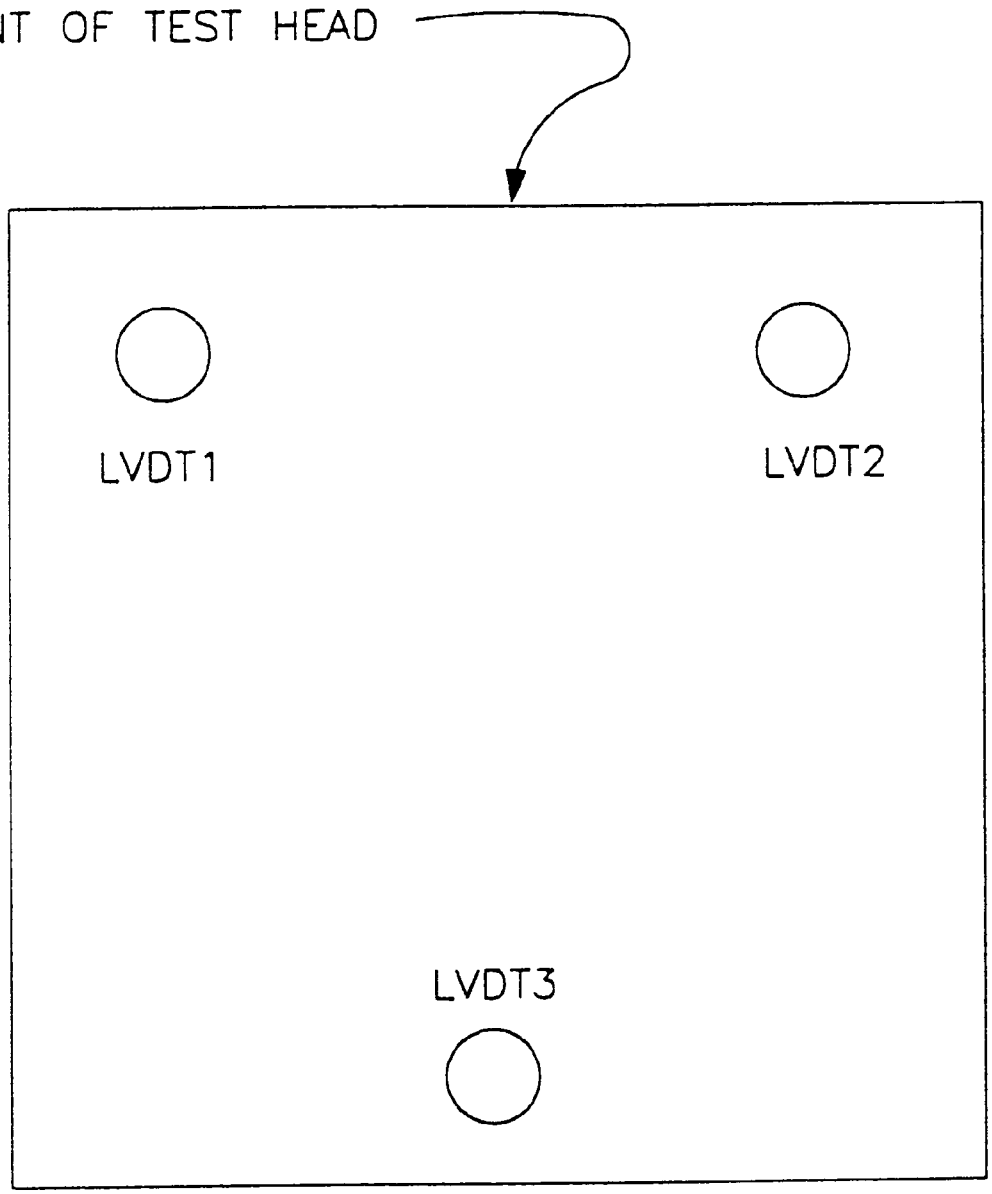
FIG. 32 illustrates the placement of linear variable displacement transducers in accordance with an alternative embodiment of the present invention.

In addition, although the invention has been described with the use of four LVDTs, in accordance with a further exemplary embodiment of the invention, only three LVDTs may be used. As shown in FIG. 32, the LVDTs can be arranged in (for example) a triangular pattern with two LVDTs towards the front of test head 110 and one LVDT towards the rear of test head 110. Of course, this pattern can be reversed (one LVDT in the front and two LVDTs in the rear). With regard to the arrangement shown in FIG. 32, the LVDTs (identified as LVDT1, LVDT2, and LVDT3) can be used to determine the previously defined pitch, roll and compression values of test head 110 relative to device handler 120 according to equations 4, 5, and 6 respectively:

$$\text{Pitch} = [(LVDT1 + LVDT2 - 2 \cdot LVDT3)/2] \quad (4)$$

$$\text{Roll} = LVDT2 - LVDT1 \quad (5)$$

$$\text{Compression} = [(LVDT1 + LVDT2 + LVDT3)/3] \quad (6)$$

In addition, a fourth LVDT may be included for redundancy to ensure that the remaining LVDTs are providing correct readings.

The invention has been described with the LVDTs externally attached to test head 110. However, one skilled in the art would readily recognize that the LVDTs can be incorporated into (i.e. be an integral part of) test head 110. Thus, by sufficiently miniaturizing the LVDTs, the LVDTs may be located within the periphery of test head 110. For example, the LVDTs may be located among contacts 14.

The invention has been described with regard to stepper motors for accomplishing motorized motion. In alternate exemplary embodiments of the present invention, a pneumatic motor or a hydraulic motor may be used. However, one skilled in the art would readily recognize that the motor can be supplemented with a counter balance system bearing the load of the carriage base 26 with the test head 110 attached. In this manner, operator and equipment safety may be enhanced.

The invention has been described with regard to a single positioner system. However, additional positioner systems, incorporating for example support members 9 and 10, may be used adjacent to the positioner system presently illustrated in the figures.

While the invention has been described in terms of an exemplary embodiment, it is contemplated that it may be practiced as outlined above with modifications within the spirit and scope of the appended claims.

What is claimed:

1. A positioner for docking and undocking an electronic test head with a device handler comprising:

head rotation means for rotating said electronic test head about a first axis;

motion means, including a plurality of arm structures coupled to said head rotation means;

a first one of said plurality of arm structures coupled to a second one of said plurality of arm structures to form a scissor shaped member of increasable and decreasable length for moving said electronic test head along a second axis orthogonal to said first axis;

inclinometer means coupled to at least one of said plurality of arm structures for providing a signal corresponding to angular orientation of said at least one arm structure; and processing means for converting said signal to a measurement of distance between said test head and said device handler.

2. A positioner according to claim 1, wherein a plurality of alignment pins are affixed to one of said electronic test head and said device handler and a plurality of alignment holes are formed in another of said electronic test head and said device handler, each of said plurality of alignment pins extending into a respective one of said plurality of alignment holes when said electronic test head is docked with said device handler.

3. A positioner according to claim 1, further comprising sensor means for determining distances between a plurality of locations on a surface of said electronic test head and a respective plurality of locations on a surface of said device handler and for generating signals corresponding to said determined distances.

4. A positioner according to claim 3, wherein said sensor means generates four signals identified as LVDT1, LVDT2, LVDT3 and LVDT4, each of said four signals corresponding to a respective one of said distances between said plurality of locations on said surface of said electronic test head and said respective plurality of locations.

5. A positioner according to claim 3, wherein said head rotation means rotates said electronic test head about said first axis and said motion means moves said test head along said second axis responsive to said signals generated by said sensor means.

6. A positioner according to claim 4, wherein said head rotation means rotates said electronic test head about said first axis and said motion means moves said test head along said second axis based upon pitch and roll of said electronic test head relative to said device handler wherein pitch is calculated as:

$$\text{pitch} = [(LVDT2 + LVDT3) - (LVDT1 + LVDT4)]/2$$

and roll is calculated as:

$$\text{roll} = [(LVDT3 + LVDT4) - (LVDT1 + LVDT2)]/2.$$

7. A positioner according to claim 2, further comprising a plurality of transducers each located under a respective one of said plurality of alignment pins, wherein misalignment between said plurality of alignment pins and said plurality of alignment holes results in said transducers generating signals indicative of said misalignment.

8. A positioner according to claim 1, further comprising movement means for at least one of:

a) moving said test head along said first axis;

b) moving said test head about said second axis;

c) moving said test head along a third axis orthogonal to both said first axis and said second axis; and d) moving said test head about said third axis.

9. A positioner according to claim 1, wherein said head rotation means and said motion means are powered.

10. A positioner according to claim 3, wherein said sensor means includes a plurality of sensors, further comprising calibration means for calibrating each of said plurality of sensors to generate respective predetermined signals upon docking of said electronic test head and said device handler.

11. A positioner according to claim 3, further comprising a calibration fixture for positioning one of said alignment pins and said alignment holes relative to the other of said alignment pins and said alignment holes.

12. A positioner according to claim 10, further comprising a calibration fixture for positioning one of said alignment pins and said alignment holes relative to the other of said alignment pins and said alignment holes.

13. A positioner according to claim 3, wherein said electronic test head and said device handler each include respective contacts, said sensor means includes a plurality of sensors, and each of said plurality of sensors are located between a respective two of said contacts on one of said electronic test head and said device handler.

14. A positioner according to claim 3, wherein said sensor means generates three signals identified as LVDT1, LVDT2 and LVDT3, each of said three signals corresponding to a respective one of said distances between said plurality of locations on said surface of said electronic test head and said respective plurality of locations.

15. A positioner according to claim 14, wherein said motion means moves said test head in a vertical direction and said head rotation means rotates said electronic test head about said first axis based upon pitch and roll of said electronic test head relative to said device handler wherein pitch is calculated as:

Pitch=(LVDT1+LVDT2−2×LVDT3)/2 and roll is calculated as:

Roll=LVDT2−LVDT1.

16. A method for docking an electronic test head with a device handler, comprising the steps of:

rotating said electronic test head about a first axis;

moving said test head along the second axis orthogonal to said first axis by increasing and decreasing length of a scissor-shaped member which includes a plurality of arm structures;

providing a signal corresponding to angular orientation of at least one of said plurality of arm structures; and converting said signal to a measurement of distance between said test head and said device handler in order to dock said electronic test head with said device handler.

17. A method for docking an electronic test head with a device handler according to claim 16, wherein said test head includes contacts, and a plurality of sensors are secured to at least one of said test head and said device handler for determining respective distances between said plurality of locations on said surface of said test head and said respective plurality of locations on said surface of said device handler, said method further comprising the steps of:

providing a calibration fixture having a planar surface;

placing said planar surface of said calibration fixture onto said contacts so that said calibration fixture extends directly above said plurality of sensors, and adjusting each of said plurality of sensors to contact said calibration fixture and generate a respective calibration signal defining docking between the test head and the device handler.

* * * * *

UNITED STATES PATENT AND TRADE MARK OFFICE
CERTIFICATE OF CORRECTION

PATENT NO.   : 5,900,737
DATED        : May 4, 1999
INVENTOR(S)  : Graham et al.

It is certified that error appears in the above-identified patent and that said Letters Patent is hereby corrected as shown below:

At column 12, line 34, "motor 132. indexer"
should read --motor 132. Indexer--.

At column 12, line 36, "module 110 transmits"
should read --module 1104 transmits--.

At column 12, line 36, "to solid stat e"
should read --to solid state--.

At column 13, line 23, "rear side hod"
should read --rear side 110d--.

Signed and Sealed this

Sixteenth Day of November, 1999

Attest:

Q. TODD DICKINSON

*Attesting Officer*          *Acting Commissioner of Patents and Trademarks*